(12) United States Patent
Shinbo et al.

(10) Patent No.: US 7,085,982 B2
(45) Date of Patent: Aug. 1, 2006

(54) PULSE GENERATION CIRCUIT AND SEMICONDUCTOR TESTER THAT USES THE PULSE GENERATION CIRCUIT

(75) Inventors: Kenichi Shinbo, Yokohama (JP); Fujio Oonishi, Yokohama (JP); Ritsurou Orihashi, Tokyo (JP); Masashi Fukuzaki, Honjyo (JP); Nobuo Motoki, Isezaki (JP)

(73) Assignee: Hitachi, Ltd., Tokyo (JP)

( * ) Notice: Subject to any disclaimer, the term of this patent is extended or adjusted under 35 U.S.C. 154(b) by 367 days.

(21) Appl. No.: 10/345,230

(22) Filed: Jan. 16, 2003

(65) Prior Publication Data

US 2003/0140286 A1  Jul. 24, 2003

(30) Foreign Application Priority Data

Jan. 18, 2002 (JP) ............................ 2002-010741

(51) Int. Cl.
*G06F 11/00* (2006.01)
*G01R 31/28* (2006.01)

(52) U.S. Cl. ........................ 714/740; 714/719

(58) Field of Classification Search ............. 714/718, 714/719, 724, 740; 365/201, 233; 327/156; 324/765

See application file for complete search history.

(56) References Cited

U.S. PATENT DOCUMENTS 6,269,051 B1 * 7/2001 Funaba et al. ............. 365/233
6,369,601 B1 * 4/2002 Ishigaki ..................... 324/765
6,392,641 B1 * 5/2002 Nishimura et al. ......... 345/213
6,684,355 B1 * 1/2004 Kawamata .................. 714/719
6,707,735 B1 * 3/2004 Makabe et al. ............. 365/201
6,768,357 B1 * 7/2004 Kimura et al. ............. 327/156

FOREIGN PATENT DOCUMENTS

| JP | 08-330920   | 12/1996 |
| JP | 09-128068   | 5/1997  |
| JP | 10-090370   | 4/1998  |
| JP | 11-074768   | 3/1999  |
| JP | 2000-275309 | 10/2000 |
| JP | 2001-124835 | 5/2001  |

* cited by examiner

*Primary Examiner*—Shelly Chase
(74) *Attorney, Agent, or Firm*—Antonelli, Terry, Stout and Kraus, LLP.

(57) ABSTRACT

A pulse generation circuit including a pulse formation circuit for generating normal and dummy pulses according to second delay value data, a data calculation circuit for calculating first delay value data at a timing at which the pulses are generated from the pulse formation circuit according to pattern data having information for determining whether to generate pulses from the pulse formation circuit, a dummy pulse control circuit for controlling generation of a dummy pulse in a no-pulse-generation cycle from the pulse formation circuit according to the second delay value data obtained by detecting the no-pulse-generation cycle from the first delay value data, and a logical gate circuit for eliminating the dummy pulses generated from the pulse formation circuit.

18 Claims, 26 Drawing Sheets

[1] DUMMY PULSE (1) (NO 2ns-DELAY) GENERATING CONDITION

[2] DUMMY PULSE (1) (2ns-DELAYED) GENERATING CONDITION

[3] DUMMY PULSE (1) (2ns-DELAYED) GENERATING CONDITION

[4] DUMMY PULSE (2) (NO 2ns-DELAY) GENERATING CONDITION

[5] DUMMY PULSE (2) (2ns-DELAYED) GENERATING CONDITION

PULSE GENERATION CIRCUIT AND SEMICONDUCTOR TESTER THAT USES THE PULSE GENERATION CIRCUIT

FIELD OF THE INVENTION

The present invention relates to a pulse generation circuit, a semiconductor tester that uses the pulse generation circuit, and methods for testing and manufacturing semiconductor devices.

BACKGROUND OF THE INVENTION

Generally, the functional test of sample ICs is performed as follows; various test signals are applied to each sample IC from an IC tester in each basic (test) cycle and each of the various response signals from the sample IC is fetched into the IC tester, then subjected to a defect/non-defect determination at the determination timing related to each of the response signals, thereby determining whether or not the IC functions normally.

On the other hand, along with the speedup of the operations of those ICs in recent years, the test performance of LSI testers used to test those ICs come to depend significantly on an accuracy of the timing at which the test waveform is generated. Especially, a very high timing accuracy is required at timing edges generated by a pulse generation circuit provided in such the LSI tester.

FIG. 16 shows a schematic block diagram of a conventional pulse generation circuit.

In FIG. 16, the pulse generation circuit 1 is mainly configured by a data calculation circuit 5; a pulse formation circuit 6; and a pulse delay circuit 7. The data calculation circuit 5 calculates delay value data 9 used to determine a pulse generation timing according to test pattern data 3 being sent from a pattern generation circuit (not shown) synchronously with an operation clock 4-1 and outputs the result to the pulse formation circuit 6 and the pulse delay circuit 7 respectively. Each of the pulse formation circuit 6 and the pulse delay circuit 7 generates pulses at specified timings according to the delay value data 9 (TC, D, A), each having a delay resolution (delay unit) different from others.

Next, the controlling operation of the pulse formation circuit 6 will be described with reference to FIG. 17. FIG. 20 shows the operation timing of each circuit block shown in FIG. 17. In FIG. 20, it is premised that a description related to the pulse formation circuit 6 is made, when the master clock 2 is 500 MHz (2 ns cycle) and the operation clock 4-1 is 250 MHz (4 ns cycle).

At first, the pulse formation circuit 6 generates pulses according to the delay value data (TC) 9-1 being sent from the data calculation circuit 5. As the delay value data 9-1 (TC) is sent synchronously with the operation clock 4-1, the pulse generation (delay) resolution of the pulse formation circuit 6 serves as the operation clock cycle (4 ns cycle in this example).

Furthermore, the pulse formation circuit 6, which uses the master clock 2 of which cycle is a half of the operation clock, can delay a half of the operation clock (=master clock cycle: 2 ns in this example) about pulses as the delay resolution. In FIG. 17, in the pulse formation circuit 6, the delay value data (D) 9-2 is latched to FFd 11 synchronously with the master clock. When the delay value data (D) 9-2 denotes "0", output pulses of FFcmp 10 outputs to the FF1 (14) side. When the data (D) 9-2 denotes "1", output pulses of FFcmp 10 outputs to the FF2 (15) side. Each of the FF1 (14) and the FF2 (15) latches received pulses. The FF2 (15) then outputs the latched pulses to the FF2' (16) of the next stage. In other words, when the delay value data (D) 9-2 denotes "1", the output pulses come to pass one more flip-flop circuit 16 operated synchronously with the master clock 2 than the delay path in response to "0" denoted by the data (D) 9-2. Therefore, the output pulses of the FF2' (16) can delay just by a cycle of the master clock for the output pulses of the FF1 (14).

On the other hand, in the pulse formation circuit 6 shown in FIG. 17, the output pulses of the FF1 (14) and the FF2' (16), generated by the operation clock 4-1, is latched to the FFor 18 through an OR gate 17 of the next stage and ANDed by the output pulses of the FFor 18 and the inverted value outputted from the FFs, which is latched once at the negative edge of the master clock 2 so as to output as inner pulses 6-1 which pulse width is shaped.

On the other hand, the pulse delay circuit 7 can delay pulses generated from the pulse formation circuit 6 by a delay resolution according to the delay value data (A) 9-3. The delay resolution is equal to or less than a half of the operation clock.

Next, the operation of the pulse delay circuit 7 will be described with reference to FIG. 18.

The pulse delay circuit 7 is mainly configured by a delay circuit 30; an FIFO 31 for reading asynchronous delay value data (A) 9-3 synchronously with output pulses 6-1; and a read FF 32.

At first, the delay value data (A) 9-3 is written in the FIFO 31 synchronously with the operation clock 4-1 and stored there. The written delay value data (A) 9-3 is read from the FIFO 31 at a timing of the trailing of the output pulse 7-1 preceding just by one pulse that has passed the pulse delay circuit 7, then inputted to the delay circuit 30.

The delay circuit 30, as shown in FIG. 19, is configured by a delay element group 34 composed of inverters, etc.; and a selection circuit 33 used to select pulse paths. In the delay circuit 30, a target path passing the pulse is selected by the selection circuit 33 according to the delay value data (A) 9-3, thereby a pulse delay value is determined.

In FIG. 19, when the delay value data denotes "1", the inputted inner pulse 6-1 passes a longer delay time path that includes the delay element group 34 (delay value: Ans). When the delay value data denotes "0", the inputted inner pulse 6-1 passes a shorter delay time path that does not include the delay element group 34.

As described above, the pulse generation circuit 1 can combine a digital delay time in the pulse formation circuit 6 with an analog delay time in the pulse delay circuit 7 to generate pulses at a desired timing.

This is why the pulse generation circuit 1 is often used for such waveform formation apparatus as pulse generation circuit, as well as for LSI tester, etc. Especially, in such the LSI tester, the pulse generation circuit 1 is required for generating pulses with very high accuracy, since the test performance significantly depends the waveform generation accuracy.

SUMMARY OF THE INVENTION

Such the conventional pulse generation circuit 1, which generates pulses at desired timing by combining a delay time set in the pulse formation circuit 6 with that set in the pulse delay circuit 7, has been confronted with a problem that the pulse generation timing varies due to power consumption changes in the circuit 1 itself, thereby the pulse generation accuracy lowers when the output pulse generation cycle changes.

Concretely, the following problems occur.

In such apparatuses as LSI testers, as the pulse generation cycle is required to vary among test patterns, the pulse generation cycle is not necessarily fixed. On the other hand, the power consumption of the pulse generation circuit 1 changes in proportion to a pulse generation cycle (pulse generation interval per unit time) and a delay time (a time to pass a delay gate in a delay circuit) given to pulses. The delay time to be given to pulses also varies among test patterns. Consequently, in such the LSI tester, the power consumption of the pulse generation circuit 1 is not kept fixedly when a test is done for different types of LSIs and/or when the test condition changes even among the same type LSIs.

As described above, unless the power consumption of the pulse generation circuit 1 is kept fixedly, the result will become as follows; (1) a voltage change caused by a power consumption change increases the jitter of the output pulses and (2) the temperature (junction temperature) in the circuit changes when the delay circuit in the pulse generation circuit 1 is mainly configured by CMOS gate arrays and the power consumption changes due to a change of the pulse generation cycle, thereby the propagation delay time in the delay circuit varies. Consequently, the pulse generation timing varies and the pulse generation accuracy deteriorates. Especially, the CMOS circuit is apt to occur an error in the propagation delay time of the circuit due to temperature and voltage changes caused by a power consumption change.

In order to solve such the problem, the pulse generation circuit 1 has been required to suppress the voltage variation and the variation of the propagation delay time of the delay circuit to be caused by the variation of the power consumption. Therefore, the technique which makes power consumption under operation regularity becomes indispensable.

According to this conventional technique, the pulse generation circuit has been provided with a power consumption circuit (the second delay circuit) in addition to the delay circuit (the first delay circuit) as shown in FIG. 21 to keep the power consumption fixedly during the operation of the pulse generation circuit.

For example, Japanese Patent Laid-Open No. H8(1996)-330920 discloses a method for generating current compensating pulses in no-pulse-generation cycles used to drive an additional dummy power consumption circuit, thereby keeping the power consumption of the pulse generation circuit fixedly.

And, Japanese Patent Laid-Open No. 2000-275309 discloses a method for reducing the variation of the power consumption occurring due to the variation of the pulse delay time by interpolating the difference between pulse delay times through the dummy delay circuit, thereby keeping the delay times of all the pulses fixedly.

The methods as described above, however, require an additional dummy delay circuit (power consumption circuit) respectively to compensate the power or delay time so as to reduce the variation of the power consumption and/or the variation of the delay time to be given to each pulse. In order for a delay circuit to make the power consumption covering the whole circuit in agreement in consideration of a required thing for every output pin, a dummy delay circuit, of which scale is equivalent to that of the normal delay circuit, is also required newly for each output pin. As the result, the subject that the circuit scale of the pulse generating circuit will increase occurred.

Under such circumstance, it is an object of the present invention to provide a pulse generation circuit that can keep the power consumption fixedly and improve the accuracy of the pulse generation time therein without requiring any additional large-scale dummy delay circuit (power consumption circuit), which has been required conventionally.

It is another object of the present invention to provide an LSI tester that can apply a test waveform of which timing (the time) is controlled accurately to sample LSIs.

It is still another object of the present invention to provide methods for testing and manufacturing semiconductor devices (LSIs) using a waveform of which timing (the time) is accurately controlled.

In order to achieve the above objects, each of the pulse generation circuit and the pulse generator being employed the pulse generation circuit is provided with dummy pulse controlling circuit for controlling the generation of dummy pulses by detecting a no-pulse-generation cycle, so that the pulse generation cycles (pulse generation interval per unit time) are adjusted using dummy pulses.

In another aspect, the pulse generation circuit of the present invention is provided with a data calculation circuit for calculating a timing at which a pulse is generated therefrom according to the pattern data that has information for determining whether to generate pulses therefrom; a dummy pulse control circuit for controlling the generation of a dummy pulse in a no-pulse-generation cycle by detecting the no-pulse-generation cycle from the pattern data; the pulse formation circuit for forming both normal and dummy pulses being generated according to the pattern data; and a logical gate circuit disposed between the pulse formation circuit and an output pin and used to eliminate the dummy pulses formed from the pulse formation circuit.

Furthermore, the semiconductor (LSI) tester of the present invention is provided with a master clock circuit; a pattern formation circuit for forming pattern data that includes information related to a test waveform; a timing generation circuit for forming the test waveform by receiving the master clock and the pattern data; a driver for applying the test waveform to each sample semiconductor device (LSI); a comparison circuit for judging an electric characteristic in accordance with a response waveform received from the sample semiconductor device (LSI); and a fail memory for storing the judgment result, wherein the timing generation circuit includes a pulse generation circuit for generating pulses to determine both rising and falling timings of the test waveform and a waveform formatter for forming the test waveform according to the pulses while the pulse generation circuit further includes a dummy pulse control circuit for generating dummy pulses in a no-pulse-generation cycle by detecting the no-pulse-generation cycle from the pattern data.

Furthermore, the semiconductor testing method of the present invention generates dummy pulses in a no-pulse-generation cycle by detecting the no-pulse-generation cycle from the pattern data that has information for determining whether to generate pulses in the pulse generation circuit, thereby testing semiconductor devices using a test waveform formed under a stable power consumption.

Furthermore, the semiconductor device manufacturing method of the present invention comprises a process of fabricating circuit elements on a semiconductor wafer; a process of wiring so that electrodes of the circuit elements are connected electrically to external terminals on the semiconductor wafer; a process of forming a protection film on the semiconductor wafer; a process of dicing the semiconductor wafer; and a process of testing the semiconductor devices still existing as the wafer or diced into individual chips, wherein the testing process includes the steps of generating dummy pulses in a no-pulse-generation cycle by detecting the no-pulse-generation cycle from the pattern data that has information to determine whether to generate pulses in the pulse generation circuit, thereby testing the semiconductor devices using a test waveform formed under stable power consumption.

DETAILED DESCRIPTION OF THE PREFERRED EMBODIMENTS

Figure 1:
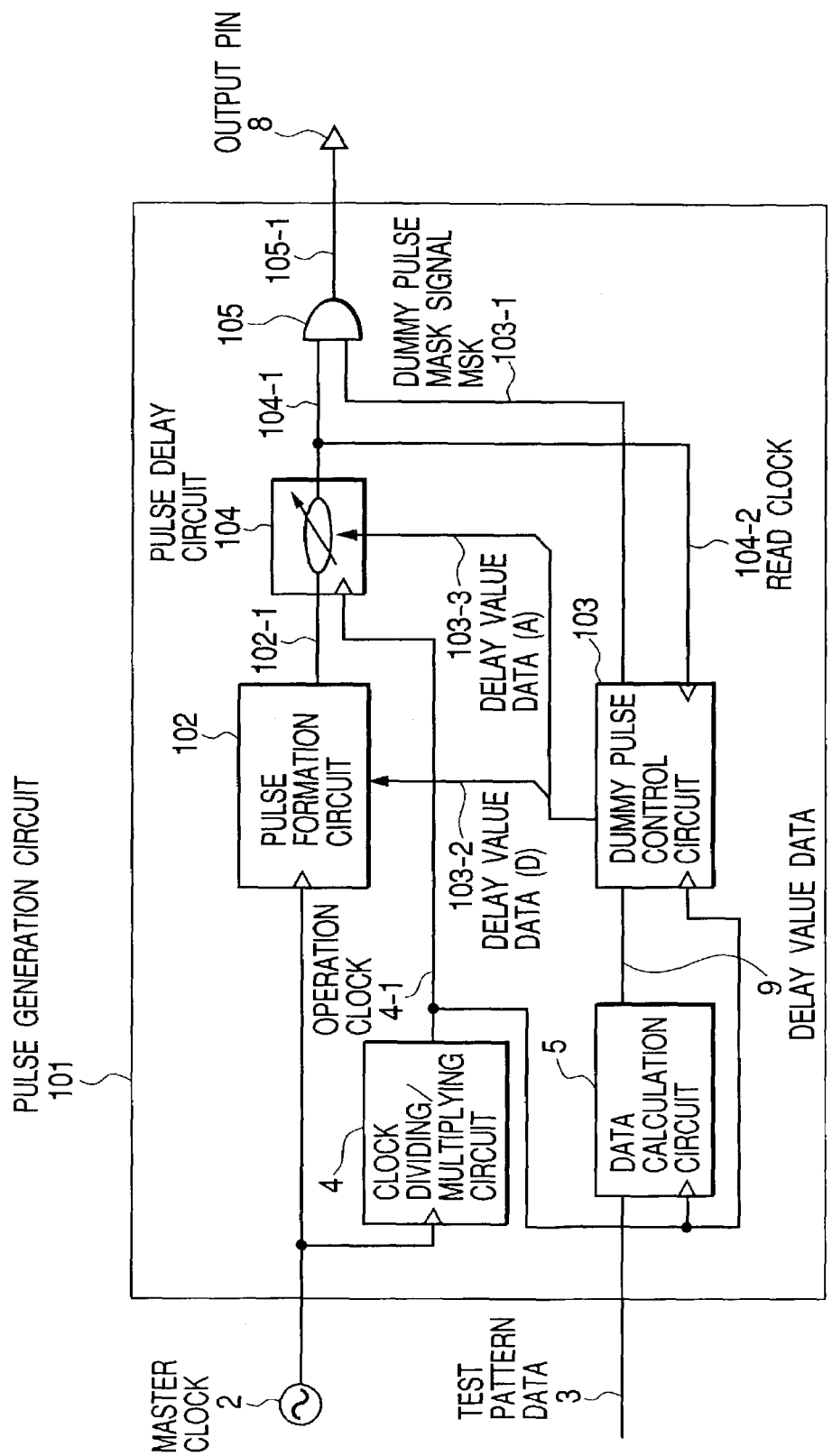
FIG. 1 is a block diagram of a pulse generation circuit 101 in the first embodiment of the present invention.

Hereunder, the preferred embodiments of the present invention will be described with reference to the accompanying drawings. In those accompanying drawings, the same reference numerals will be used for the same functional items, avoiding the redundant description.

First Embodiment

FIG. 1 shows a block diagram of a pulse generation circuit in this first embodiment of the present invention.

The pulse generation circuit 101 in this first embodiment comprises a master clock circuit 2; a clock dividing/multiplying circuit 4 for dividing/multiplying the master clock 2; a data calculation circuit 5 for calculating a timing at which an output pulse is generated (delay value data 9 (TC, D, A)) according to test pattern data 3 received from a pattern formation circuit (not shown); a dummy pulse control circuit 103 for controlling the generation of dummy pulses by detecting a no-pulse-generation cycle (time, period) from the test pattern data 3 received from the pattern formation circuit (the calculated delay value data 9 (TC, D, A)) so as to control the generation of dummy pulses; a pulse formation circuit 102 for forming both normal and dummy pulses at timings synchronized with the master clock according to the delay value data (D) 103-2; a pulse delay circuit 104 capable of delaying the output pulse by a slight delay time being not more than the master clock cycle according to the delay value data (A) 103-3; and an AND gate 105 for masking dummy pulses which include in the output pulses of the pulse delay circuit 104.

The configuration of the pulse generation circuit 101 in the first embodiment can thus fix the number of pulses generated per unit time in the pulse formation circuit 102, thereby the power consumption of the whole pulse generation circuit can be kept fixedly.

Hereinafter, the operation of the pulse generation circuit 101 will be described in detail.

In this first embodiment, it is premised that in the pulse generation circuit 101, the master clock 2 is 500 MHz (2 ns cycle), the operation clock 4-1 is 250 MHz (4 ns cycle) that is generated by dividing the master clock to a half in the clock dividing/multiplying circuit 4. Those clock cycles may be varied as needed.

At first, the data calculation circuit 5 calculates delay value data (TC) 9-1, (D) 9-2, and (A) 9-3 used to determine a pulse generation timing respectively according to the test pattern data 3 received from the pattern formation circuit (not shown) synchronously with the operation clock 4-1 and outputs the calculated result at a timing synchronized with the operation clock. The delay value data (TC) 9-1, (D) 9-2, and (A) 9-3 output from the data calculation circuit 5 is transferred to the dummy pulse control circuit 103.

Each of the delay value data 9 (TC, D, and A) has a pulse delay resolution different from each other. In this first embodiment, the delay value data (TC) 9-1 uses a delay unit, which is one cycle (4ns in this embodiment) of the operation clock 4-1. The delay value data (D) 9-2 uses a delay unit, which is one master clock cycle (a half cycle (2 ns in this embodiment) of the operation clock 4-1). The delay value data (A) 9-3 uses slight delay units being not more than the master clock cycle (a half cycle of the operation clock 4-1). In this first embodiment, the delay unit of the delay value data (D) 9-2 is smaller than the delay resolution of the delay value data (TC) 9-1.

Figure 2:
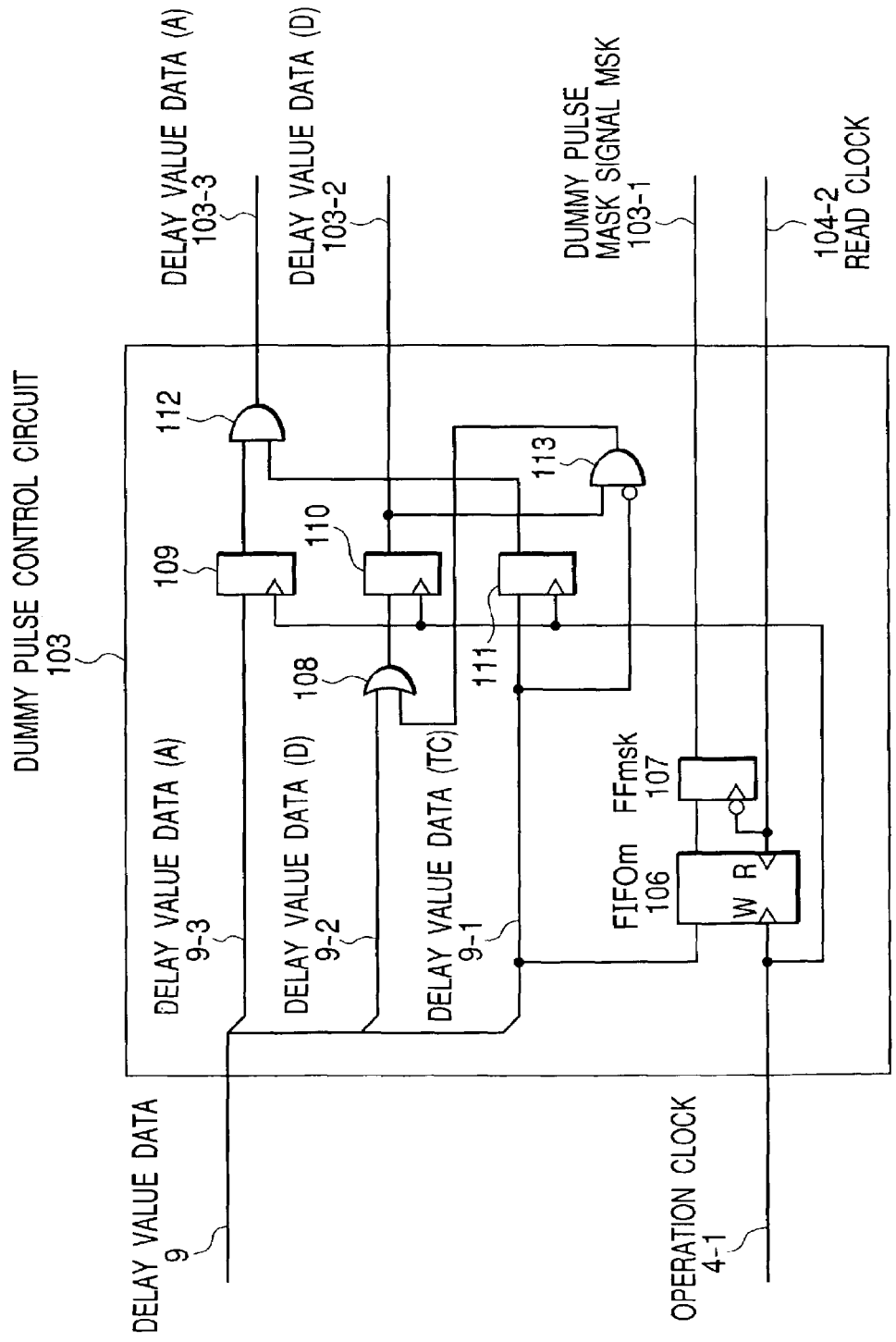
FIG. 2 is a circuit diagram of a dummy pulse control circuit in the first embodiment of the present invention.

FIG. 2 shows a block diagram of the dummy pulse control circuit 103. The dummy pulse control circuit 103 detects "0" of the delay value data (TC) 9-1 received from the data calculation circuit 5, that is, a cycle in which no normal pulse is generated in the pulse generation circuit 101 (a cycle in which the pulse generation circuit 101 is not required to generate normal pulses for forming a test waveform to be applied to a sample LSI) and controls both delay value data (D) 9-2 and (A) 9-3 so that dummy pulses are generated in that no-pulse generation cycle (time, period).

Normal pulses are pulses generated by the pulse generation circuit 101 (pulses generated by the pulse formation circuit 102) according to the test pattern data 3 received from the pattern formation circuit. Dummy pulses are pulses that are not necessarily generated by the pulse generation circuit 101 from the test pattern data 3 received from the pattern formation circuit; they are generated by the pulse formation circuit 102 so as to keep the power consumption of the whole pulse generation circuit 101 fixedly.

The dummy pulse control circuit 103 is configured by latches FFs 109 to 111 for latching the delay value data 9 once; logical gates 108, 112 to 113 for controlling the output of dummy pulses according to the delay value data 9; and an FIFOm 106 and an FFmsk 107 for outputting the delay value data (TC) 9-1 as dummy pulse mask signals MSK 103-1 synchronously with dummy pulses.

In the dummy pulse control circuit shown in FIG. 2, a pipe line is formed by the FFs 109 to 111 provided in each delay value data path. The FF output data is assumed as the delay value data in the current cycle (4 ns). The data before being latched by the FF is assumed as the delay value data in the next 4 ns cycle. The dummy pulse control circuit 103 determines whether to generate pulses in the next cycle according to the delay value data (TC, D) before being latched by this FF so as to control the generation of dummy pulses. Consequently, as the dummy pulse control circuit 103 can determine whether or not there are any normal pulses in the cycle when whether to generate dummy pulses is determined, the number of pulses to be generated per unit time can be fixed in the pulse formation circuit 102.

The delay value of the dummy pulses generated in the next cycle should preferably be determined by the delay value data in the current cycle so as not to be continued to the pulses generated in the current cycle. If a normal pulse in the current cycle is continued to a dummy pulse to be generated in the next cycle, when the normal pulse or dummy pulse is shifted even slightly in timing, they come to be connected and look like one pulse. And, in such a case, the pulse formation circuit is disabled to form normal pulses accurately. The AND circuit 113, when the 2 ns delay value data of the pulse generated in the current cycle denotes "1", functions so that the 2 ns delay value data of the pulse to be generated in the next cycle also denotes "1". The AND circuit 112 controls so that dummy pulse delay value data being less than 2 ns always denotes "0" (see FIG. 5).

The logical circuit configuration of the dummy pulse control circuit 103 shown in FIG. 2, which includes a delay time set in each dummy pulse (0 ns or 2 ns in FIG. 2) may not be limited only to that if the logic enables the number of pulses generated per unit time to be fixed.

The dummy pulse control circuit 103 also forms a mask signal 103-1 used to mask (eliminate) dummy pulses in the last stage of the pulse generation circuit 101. The dummy pulse mask signal MSK 103-1 is data for denoting a normal pulse generation timing; in FIG. 2, the delay value data (TC) 9-1 is used. In this connection, however, as dummy pulses generate at proper timings, the delay value data (TC) 9-1 and the dummy pulse mask signal MSK 103-1 are de-synchronized with each other in timing. In other words, because both normal and dummy pulses output from the pulse formation circuit 102 and the pulse delay circuit 104 are a synchronous with the mask signal, some means is required to synchronize them. In FIG. 2, the FIFO (buffer) is used to form the dummy pulse mask signal 103-1 synchronized with the output pulse by writing the delay value data (TC) 9-1 in the FIFOm 106 by the cycle of the operation clock 4-1 and by reading out the delay value data (TC) 9-1 from the FUFOm 106 as a read clock 104-2 at the falling timing of the pulse before one cycle of the pulse 104-1 which is output from the pulse delay circuit 104.

Next, the controlling operation of the pulse formation circuit 102 will be described with reference to FIG. 3.

The pulse formation circuit 102 uses the master clock 2 (2 ns in this embodiment) as the operation clock so as to delay pulses in cycles of 2 ns.

Figure 3:
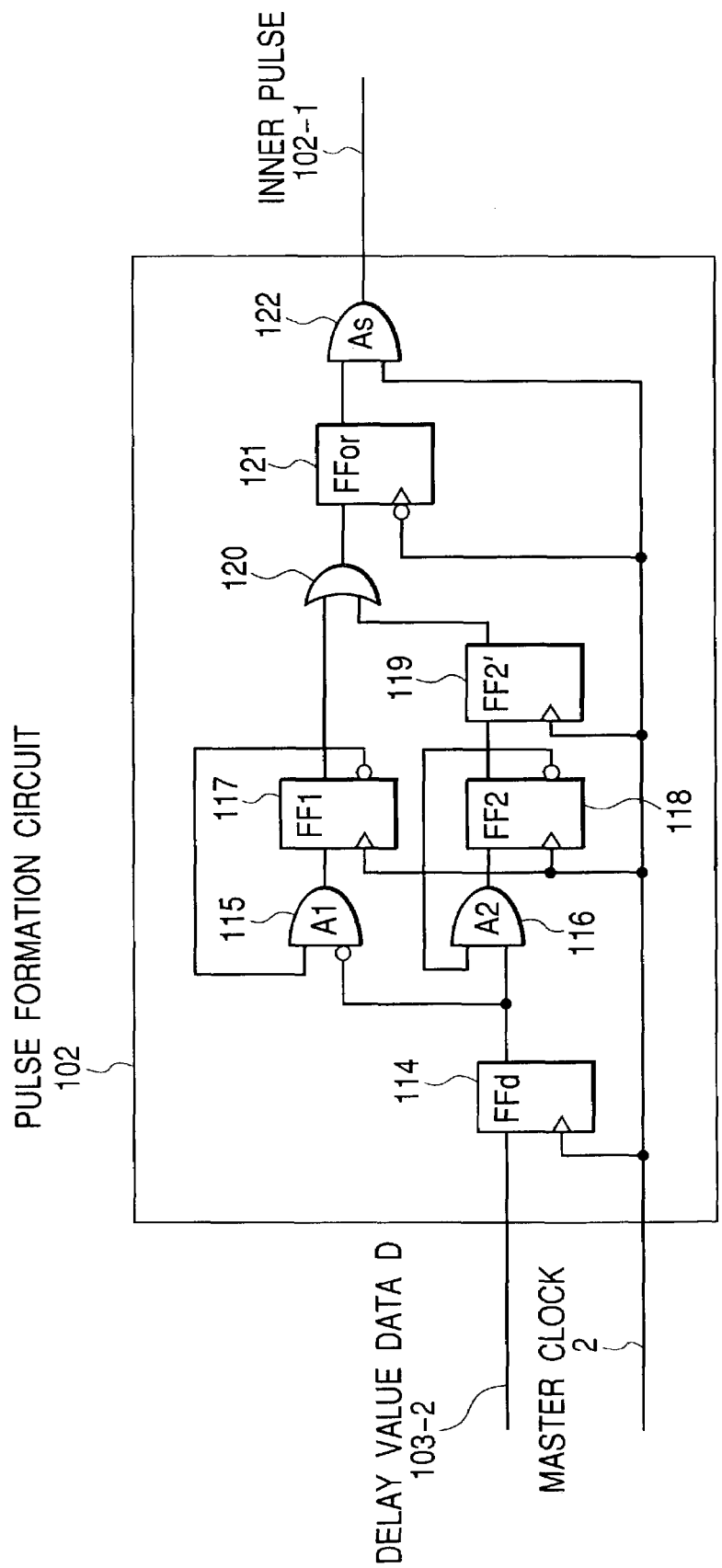
FIG. 3 is a circuit diagram of a pulse formation circuit in the first embodiment of the present invention.

In FIG. 3, 2 ns delay value data (D) 103-2 is latched by the FFd 114 synchronously with the master clock 2 so that it is used by the selection circuit as a select signal in the next stage. When the delay value data (D) 103-2 denotes "0", pulses output from the FFd 114 are transferred to the FF1 (117) side. When the data (D) denotes "1", pulses output from the FFd 114 are transferred to the FF2 (118) side. The FF1 (117) and the FF2 (118) latch received pulses respectively and the FF2 (118) outputs the pulses to the FF2' (119) in the next stage. In other words, when the 2 ns delay value data (D) 103-2 denotes "1", pulses come to pass one more flip-flop circuit that operates synchronously with the master clock 2 (2 ns) than usually, inputted pulses are delayed by 2 ns to be output.

Furthermore, in the pulse formation circuit 102 shown in FIG. 3, the outputs of the FF1 (117) and the FF2' (119) are latched by the FFor 121 through the OR gate (120) in the next stage so as to reduce the width of the output pulses, then the master clock 2 and the output of the FFor 121, which is latched once at the negative edge of the master clock 2, are ANDed (As 122).

After this, in the pulse delay circuit 104, pulses generated by the pulse formation circuit 102 can be delayed by a slight time being less than the master clock cycle (2 ns) according to the less-2 ns delay value data (A) 103-3.

Next, the operation of the pulse delay circuit 104 will be described with reference to FIG. 4.

The pulse delay circuit 104 is mainly configured by a delay circuit 30; an FIFO 31 for reading asynchronous delay value data (A) 103-3 synchronously with the output pulses; and a read FF 32.

At first, less-2 ns delay value data (A) 103-3 is written in the FIFO 31 synchronously with the operation clock 4-1 and stored there. The written delay value data (A) 103-3 is read from the FIFO 31 at the falling edge of the output pulse before one cycle of the output pulse 104-1 which passes the pulse delay circuit 104. The data (A) 103-3 is then inputted to the delay circuit 30.

Figure 19:
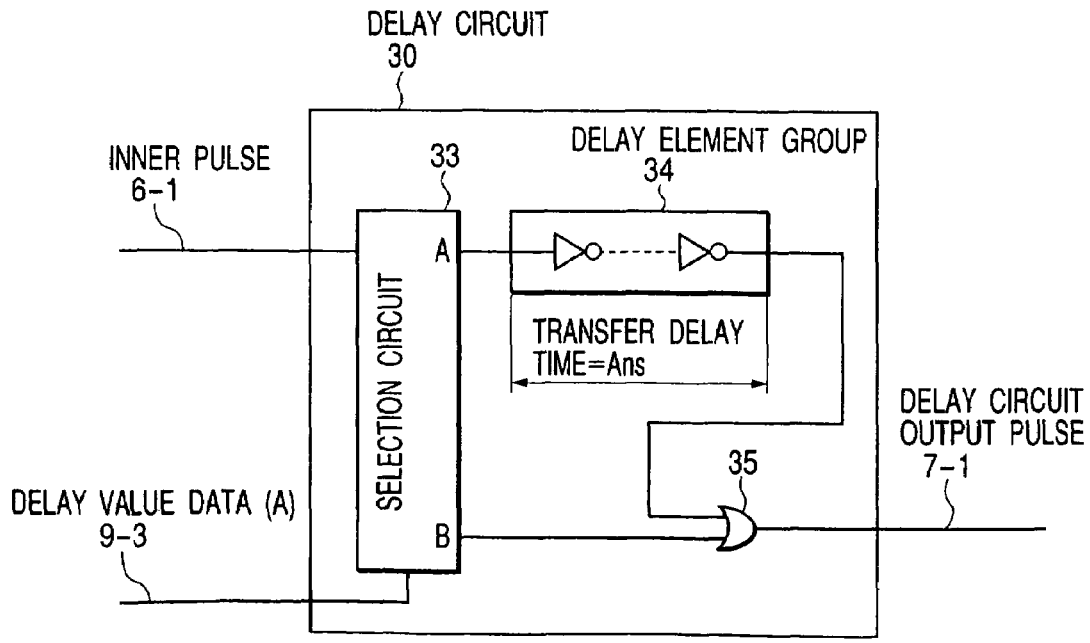
FIG. 19 is a circuit diagram of a delay circuit provided in the conventional pulse generation circuit.

The delay circuit 30, as shown in FIG. 19, is configured by a delay element group 34 composed of inverters, etc. and a selection circuit 33 for selecting a pulse path. The delay circuit 30 selects a pulse path according to the delay value data (A) 9-3, thereby a pulse delay time is determined.

In the example shown in FIG. 19, when delay value data denotes "1", the inputted inner pulse 6-1 passes a longer delay time path that includes the delay element group 34 (delay time Ans). Consequently, if the delay caused by the wiring is ignored at this time, the pulse output comes to be delayed by the time of Ans. When the delay value data denotes "0", the pulse 6-1 passes a shorter delay time path that does not include the delay element group 34, thereby the pulse output is not delayed (0 ns).

Figure 4:
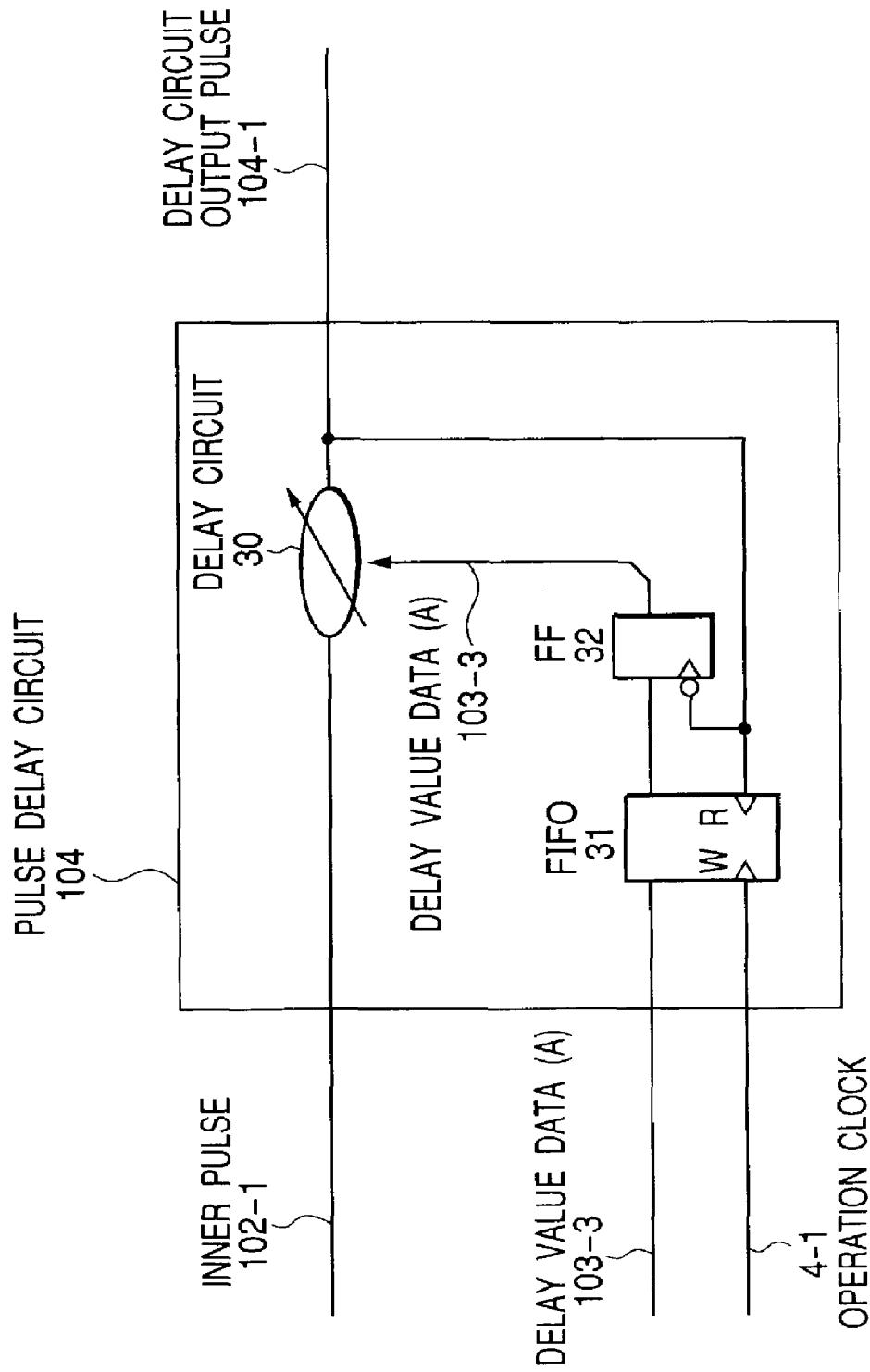
FIG. 4 is a circuit diagram of a pulse delay circuit in the first embodiment of the present invention.

In FIG. 4, only one pulse delay circuit 104 is shown. However, it is also possible to configure the pulse delay circuit 104 with multiple stages and increase the number of delay path (delay time) combinations to expand the variable delay width, as well as set the pulse delay more in detail.

Figure 5:
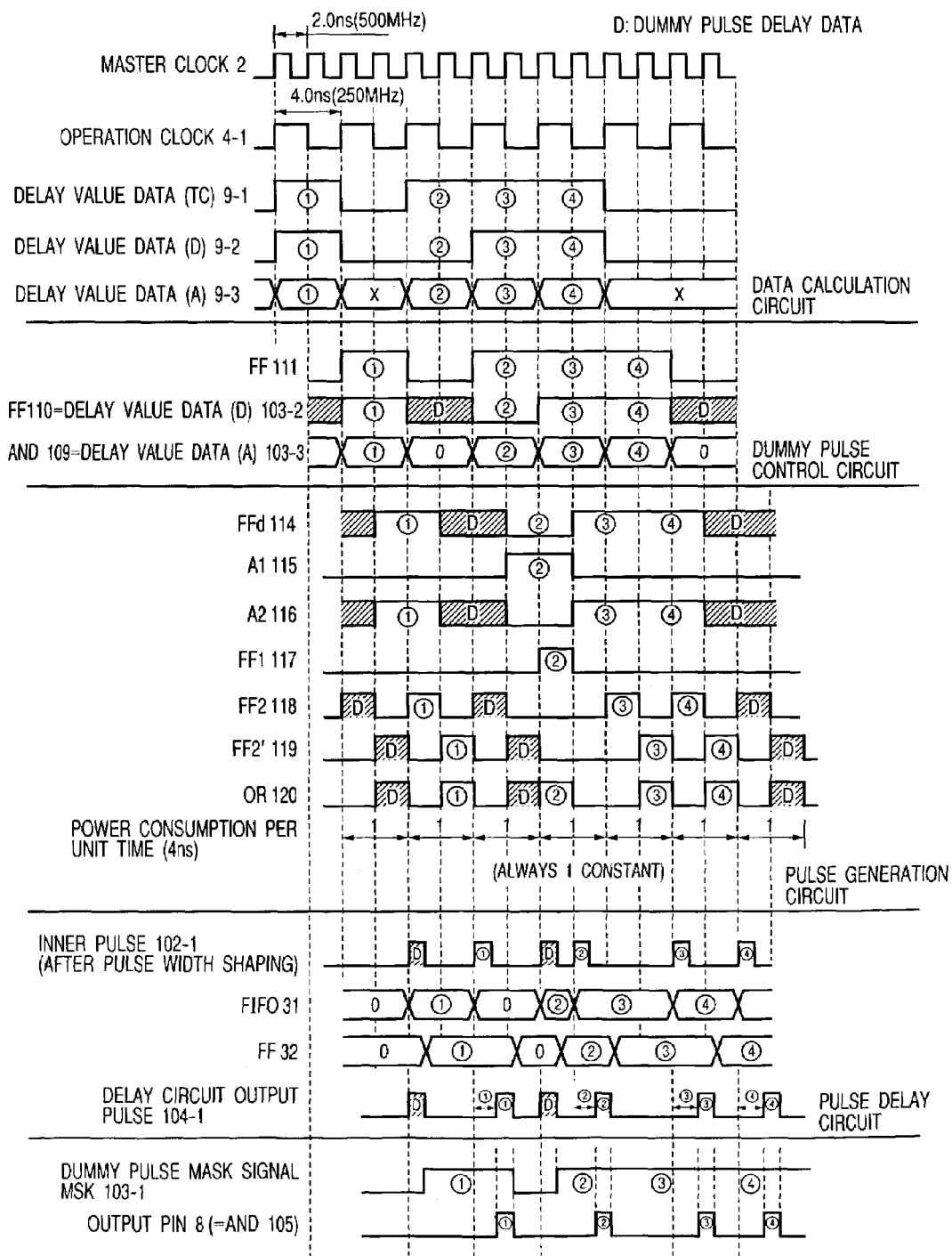
FIG. 5 is a timing chart of each circuit unit (portion) shown with respect to the effect of the present invention in the first embodiment of the present invention.
Figure 6:
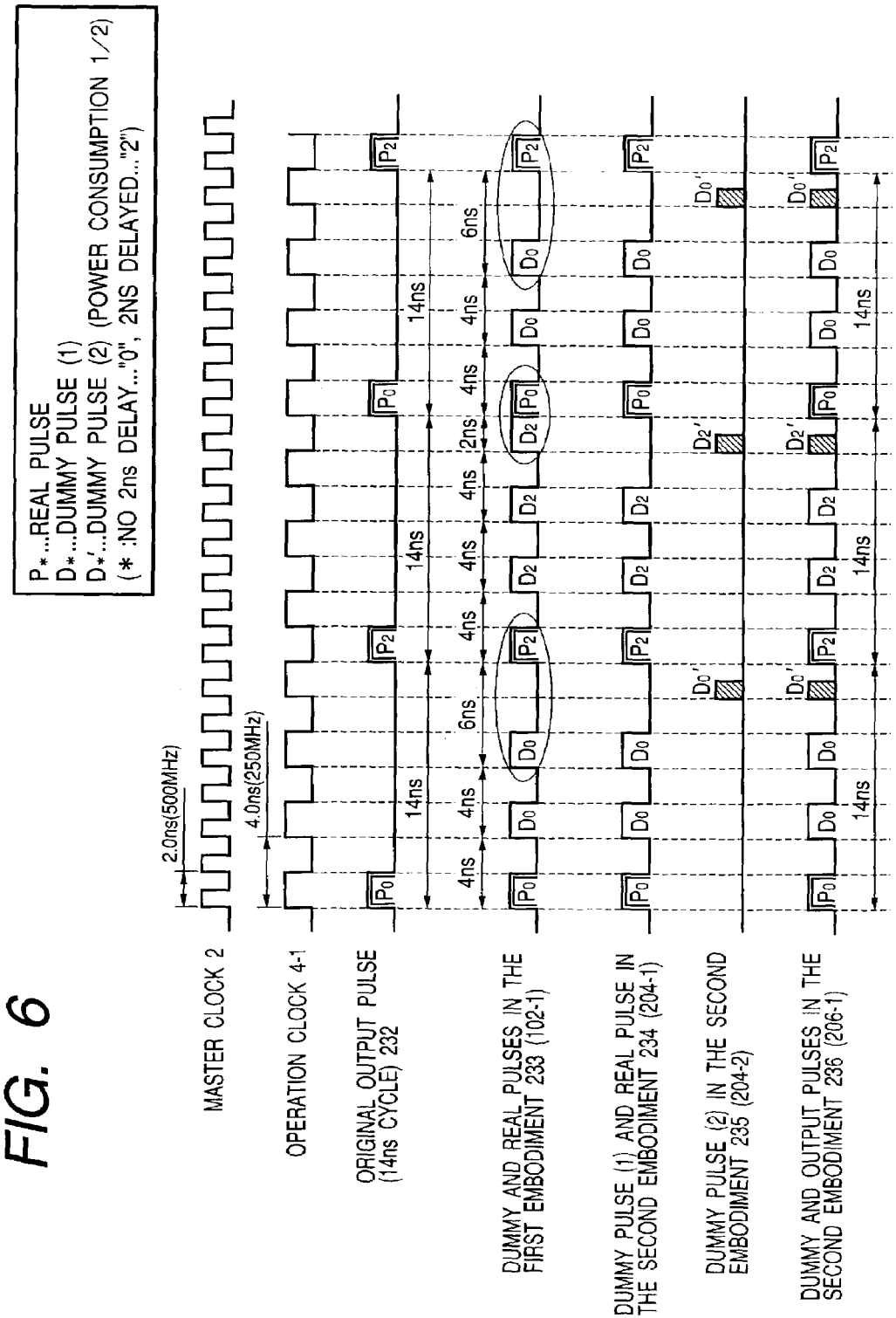
FIG. 6 is a diagram of a subject to be solved in the second embodiment of the present invention.

FIG. 5 shows the operation timing of each circuit unit (portion) in the pulse generation circuit.

As shown in the timing chart shown in FIG. 5, dummy pulses are formed according to the dummy pulse delay value data controlled by the dummy control circuit in the pulse generation circuit in this embodiment. Because of the dummy pulses generated in such a way, one pulse is kept generated in each 4 ns cycle from the pulse generation circuit. This is why the power consumption per unit time can be kept fixedly.

In this embodiment, because the dummy pulse control circuit 103 detects a no-pulse-generation cycle so as to generate dummy pulses in that no-pulse-generation cycle as described above, the pulse generation per unit time (4 ns operation clock in this embodiment) can be controlled so as to keep the power consumption per unit time fixedly.

Furthermore, because both normal and dummy pulses pass through the same delay circuit, there is no need to provide the pulse generation circuit with any special power consumption circuit, thereby the power consumption of the pulse generation circuit can be stabilized without expanding the circuit in scale.

Furthermore, because the power consumption of the pulse generation circuit 101 can be kept fixedly as described above, it is possible to suppress both voltage variation and temperature changes therein to improve the accuracy of the pulse generation time, thereby such a new pulse generation circuit 101 comes to be realized.

Second Embodiment

Next, the second embodiment of the present invention will be described with reference to FIGS. 6 through 11.

The pulse generation circuit 201 of the present invention comprises a master clock circuit 2; a clock dividing/multiplying circuit 4 for dividing/multiplying the master clock; a data calculation circuit 5 for calculating a timing at which a pulse is generated (delay value data 9 (TC, D, A)) according to test pattern data 3 received from a pattern generation circuit (not shown); a dummy pulse control circuit 203 for detecting a no-pulse-generation cycle to control the generation of at least one or more dummy pulses in the no-pulse-generation cycle; a pulse formation circuit 202 for forming at least one or more types of dummy pulses and normal pulses according to the output data (delay value data (TC) 203-1, 203-3, (D) 203-2, 203-4) from the dummy pulse control circuit 203; a pulse delay circuit 206 capable of delaying output pulses by a slight time being not more than the master clock cycle according to the delay value data (A) 203-5 and provided with means for adjusting the number of the delay circuits through which pulses pass according to a dummy pulse type; and an AND gate 212 for masking dummy pulses included in the output 206-1 (236) from the pulse delay circuit 206.

It is premised in this second embodiment that the master clock is 500 MHz (2 ns cycle) and the operation clock 4-1 is 250 MHz (4 ns cycle) generated by dividing the master clock to a half by the clock dividing/multiplying circuit 4 in the pulse generation circuit 201.

In the pulse generation circuit described in the first embodiment, the number of pulses generated per unit time (operation clock cycle) is fixed regardless of the normal pulse generation cycle, thereby the power consumption of the pulse generation circuit per operation clock cycle can be kept fixedly. However, as shown in the waveform 233 (102-1) in FIG. 6, for example, when normal pulses 232 are generated accurately in 14 ns cycles, the pulses are not always generated accurately in 4 ns cycles (as shown in an encircled portion), thereby the power consumption per shorter unit time (ex., 2 ns) is not kept fixedly.

In order to solve this subject, in this second embodiment, the dummy pulse control circuit 203 detects whether or not any pulse is output in the current cycle and detects a no-pulse-generation time (pulse interval) from both of the delay value data of the pulse in the next cycle and the delay value data of the pulse in the cycle after the next cycle so as to control the output of two types of dummy pulses on the following conditions, thereby keeping the power consumption per 2 ns cycle (master clock cycle) fixedly.

(Condition 1) When an 8 ns interval t (two cycles of operation clocks) and over (t≧8 ns) between two consecutive pulses is empty;

Operation 1 . . . A power consumption "1" dummy pulse (1) is generated at a timing 4 ns after the previous one.

(Condition 2) When an interval t between two consecutive pulses is 6 ns to not more than 8 ns (6 ns≦t<8 ns);

Operation 2 . . . A power consumption "0.5" dummy pulse (2) is generated at a timing 4 ns after the previous one.

(Condition 3) When an interval between two consecutive pulses is not more than 6 ns;

Operation 3 . . . No dummy pulse is generated.

For example, while pulses are generated in 4 ns cycles and the power consumption in one cycle is defined as "1" in a pulse generation circuit that uses an operation clock 4-1 of which cycle is 250 MHz (4 ns cycle), one pulse generation requires "1.5" power consumption if pulses are generated in 6 ns cycles. Otherwise, the power consumption per unit time is not kept fixedly.

To avoid this problem, the dummy pulse control circuit 203 controls the pulse formation circuit 204 according to the output data (TC) 203-3, (D) 203-4 so that the pulse formation circuit 204 is formed a dummy pulse (2)235 (204-2) having "0.5" power consumption 4 ns after the previous pulse and the rest 2 ns power consumption that cannot be accepted by the dummy pulse (1) 234 (204-1) is compensated by the dummy pulses (2) 235 (204-2) to keep the power consumption per unit time (master clock cycle=2 ns) fixedly.

Figure 9:
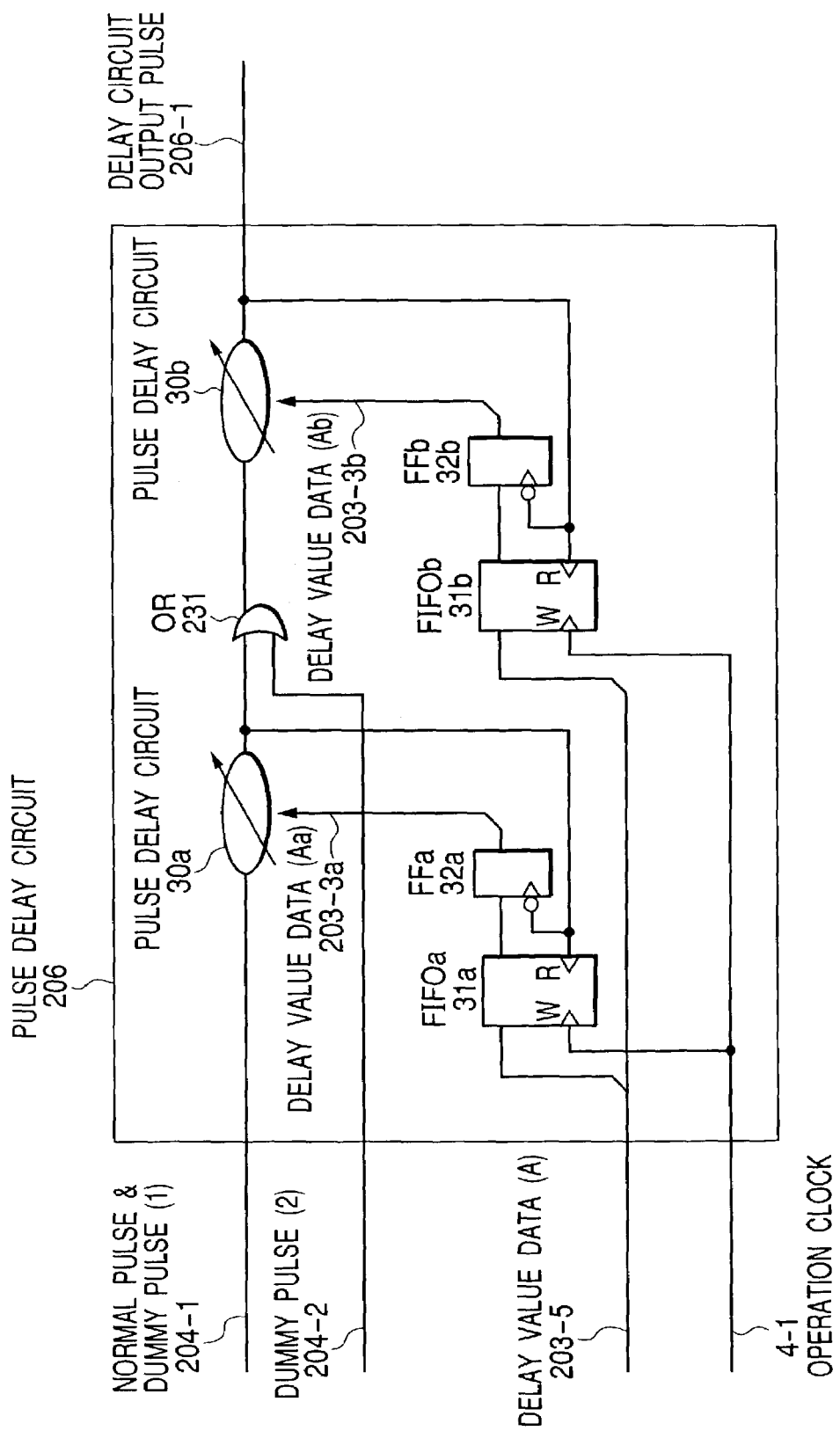
FIG. 9 is a circuit diagram of a pulse delay circuit in the second embodiment of the present invention.

At this time, the dummy pulses (2) 204-2 passes through the latter half 30*b* of the pulse delay circuit 206 that is divided into two units 30*a*, 30*b* as shown in FIG. 9 to obtain the "0.5" power consumption.

Figure 7:
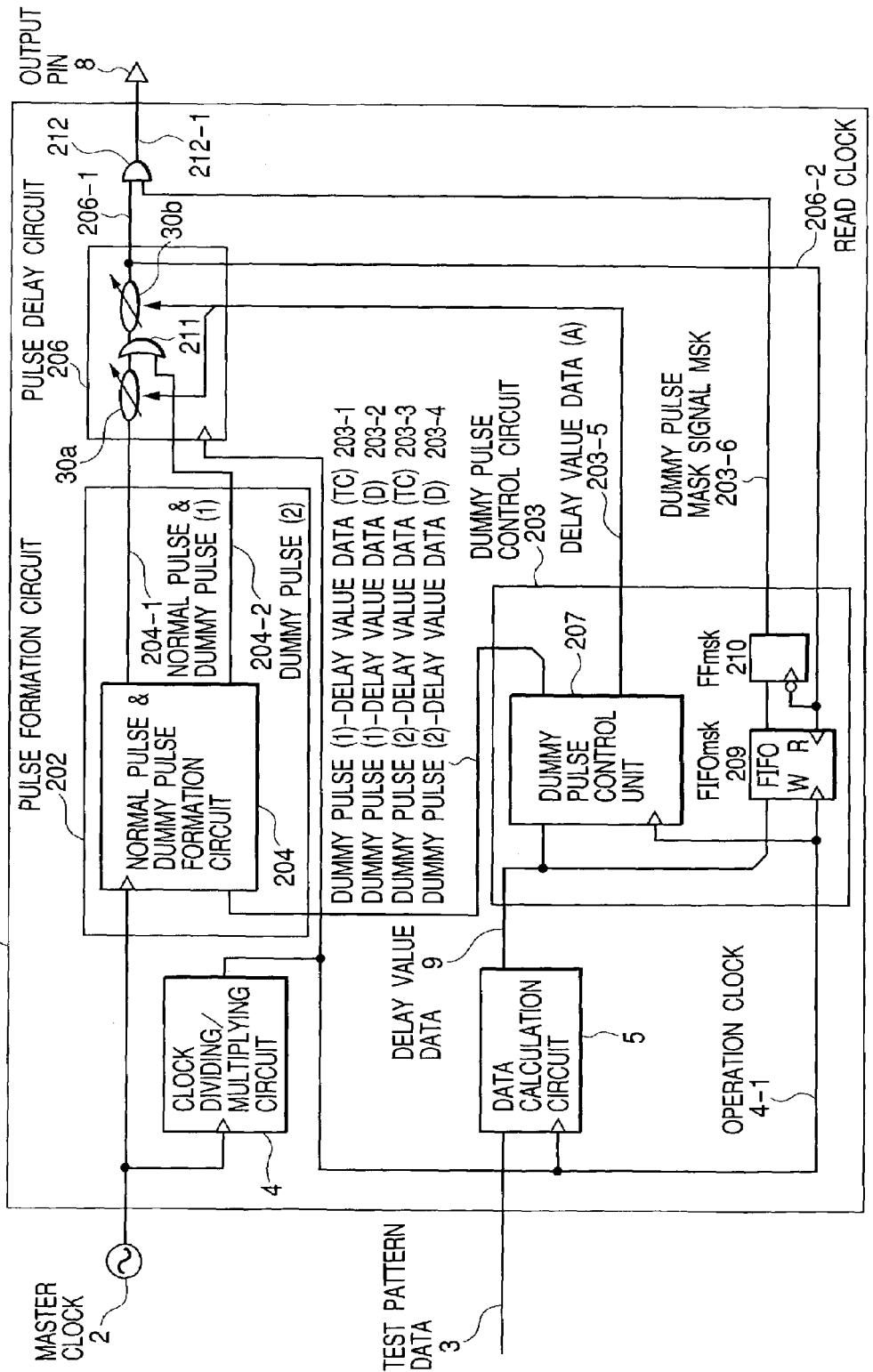
FIG. 7 is a pulse generation circuit 201 in the second embodiment of the present invention.

Next, the configuration of the dummy pulse control circuit 203 will be described with reference to FIGS. 7 and 8.

The dummy pulse control circuit 203 is configured by a dummy pulse control unit 207 for controlling the formation of the dummy pulses (1) and (2) in the pulse formation circuit 202 according to the delay value data 9, as well as an FIFOmsk 209 and an FFmsk 210 for outputting the dummy pulse mask signal MSK 203-6. The dummy pulse control circuit 203 transfers the delay value data 9 received from the data calculation circuit 5 synchronously with the operation clock 4-1 so that the dummy pulse control unit 207 forms delay value data 203-1, 203-2, 203-3 and 203-4 for normal pulse & dummy pulse (1) 204-1 and dummy pulse (2) 204-2 by detecting the no-pulse-generation cycle according to the delay value data 9.

Figure 20:
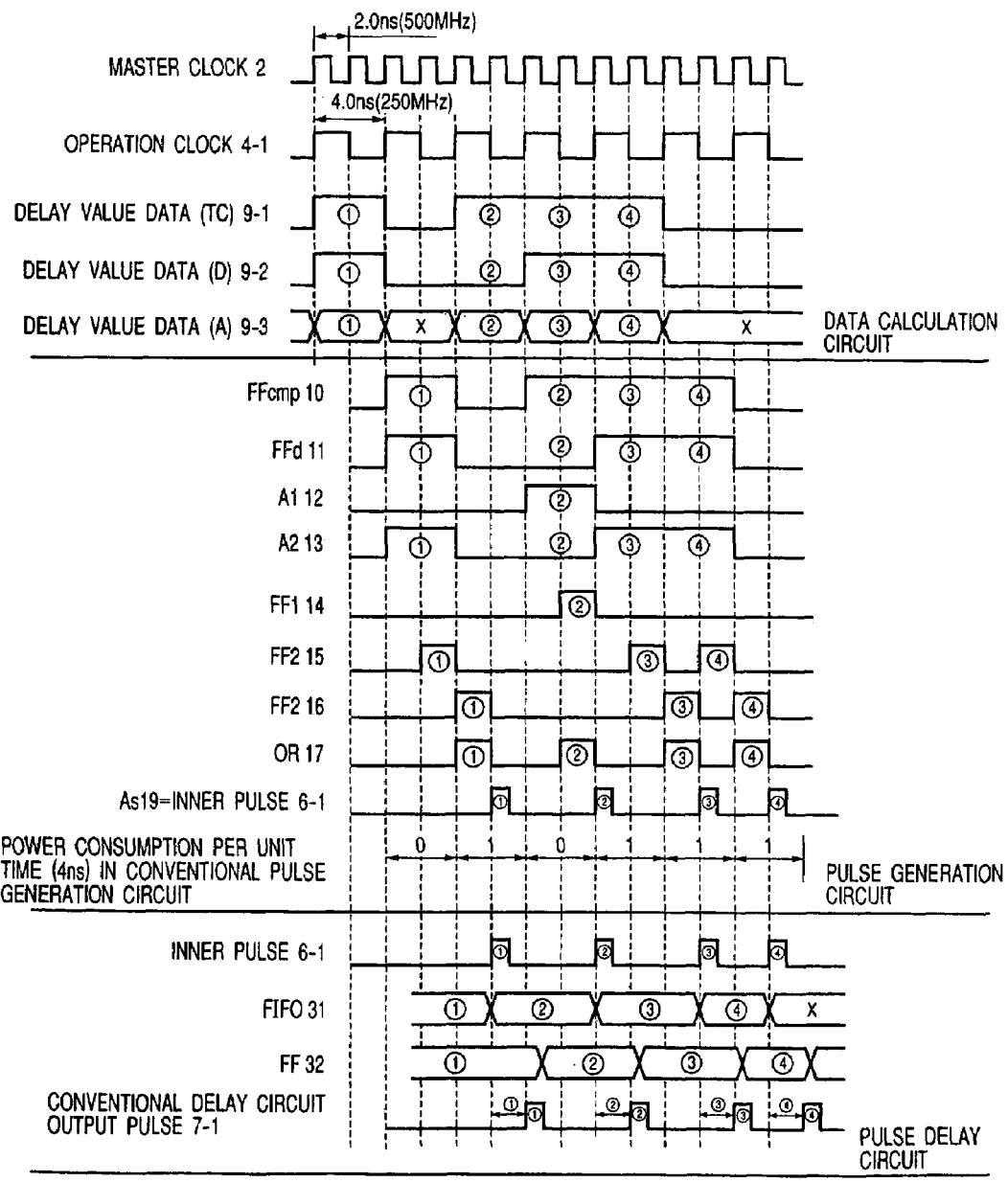
FIG. 20 is a timing chart of each circuit unit in the conventional pulse generation circuit.

Here, how the dummy pulse control unit 207 controls dummy pulse outputs will be described with reference to FIGS. 8 and 20.

The dummy pulse control unit 207 configured by two steps of pipe lines using FFs 213 to 220 transfers each delay value data 9-1, 9-2 and 9-3. The output latched in the FFs 216 to 218 is shown the delay value data 203-1, 203-2 and 203-5 in the current cycle. The delay value data existing between the FFs 213 to 215 and the FFs 216 to 218 is shown the delay value data in the next cycle. The delay value data latched in the FFs 213 to 215 is shown the delay value data in the cycle after the next cycle.

The dummy pulse control unit 207 can also control whether to generate dummy pulses and a type of dummy pulses to be generated according to those delay value data.

The dummy pulse control unit 207 in this embodiment can generate two types of dummy pulses.

There are the following five conditions for generating the two type of dummy pulses. Each of the conditions will be described with reference to the truth value tables in FIGS. 8 and 12.

The pulse symbols shown in FIG. 12 have the following meanings; "P" denotes a normal pulse, "D" denotes a dummy pulse (1), and "D'" denotes another dummy pulse (2). The numbers "0" and "2" put under each symbol denote whether or not there is 2 ns delay value data for the pulse.

At first, the dummy pulse (1) generation conditions will be described.

[1] When the 2 ns delay value data of the pulse generated in the current cycle denotes "0" and the 4 ns delay value data in the next cycle denotes "0", no pulse is to be generated for 8 ns or more in and after the current cycle. Consequently, the AND 221 is instructed to generate delay value data of the dummy pulse (1)(with no 2 ns delay) in the next cycle (see FIG. 12A).

[2] When the 2 ns delay value data generated in the current cycle denotes "1" and the 4 ns delay value data of each of the pulses to be generated in the next cycle and in the cycle following the next cycle denotes "0", no pulse is to be generated for 8 ns or more in and after the current cycle pulse. Consequently, the AND 223 is instructed to generate the dummy pulse (1) of the delay value data (with a 2 ns delay) in the next cycle (see FIG. 12B).

[3] When the 2 ns delay value data of the pulse generated in the current cycle denotes "1" and the 4 ns delay value data in the next cycle denotes "0" and further the 4 ns delay value data of each of the pulses to be generated in the next cycle and in the cycle following the next cycle denotes "1", an 8 ns interval between the current cycle pulse and the next cycle pulse is empty. Consequently, the AND 224 is instructed to generate delay value data of the dummy pulse (1) (with a 2 ns delay) in the next cycle (see FIG. 12C).

Next, the conditions for generating the dummy pulse (2) will be described.

[4] When the 2 ns delay value data of the pulse generated in the current cycle denotes "0" and the 4 ns delay value data and the 2 ns delay value data of each of the pulses to be generated in the next cycle and in the cycle following the next cycle denotes "1", a 6 ns interval between the current cycle pulse and the next cycle pulse is empty. Consequently, the AND 228 is instructed to generate delay value data of the "0.5" power consumption dummy pulse (2) (with no 2 ns delay) 4 ns after current cycle (see FIG. 12D).

[5] When the 2 ns delay value data of the pulse generated in the current cycle denotes "1", the 4 ns delay value data of the pulse to be generated in the next cycle denotes "0", the 4 ns delay value data of the pulse and the 2 ns delay value data of the pulse to be generated respectively in the cycle following the next cycle denotes "1" and "0", a 6 ns interval between the current cycle pulse and the next cycle pulse is empty. Consequently, the AND 229 is instructed to generate delay value data of the "0.5" power consumption dummy pulse (2) (with a 2 ns delay) 4 ns after the current cycle pulse (see FIG. 12E).

Furthermore, the AND 225 controls so that the delay value data (A) 203-5 denotes "0" in a dummy-pulse-generation cycle.

Figure 8:
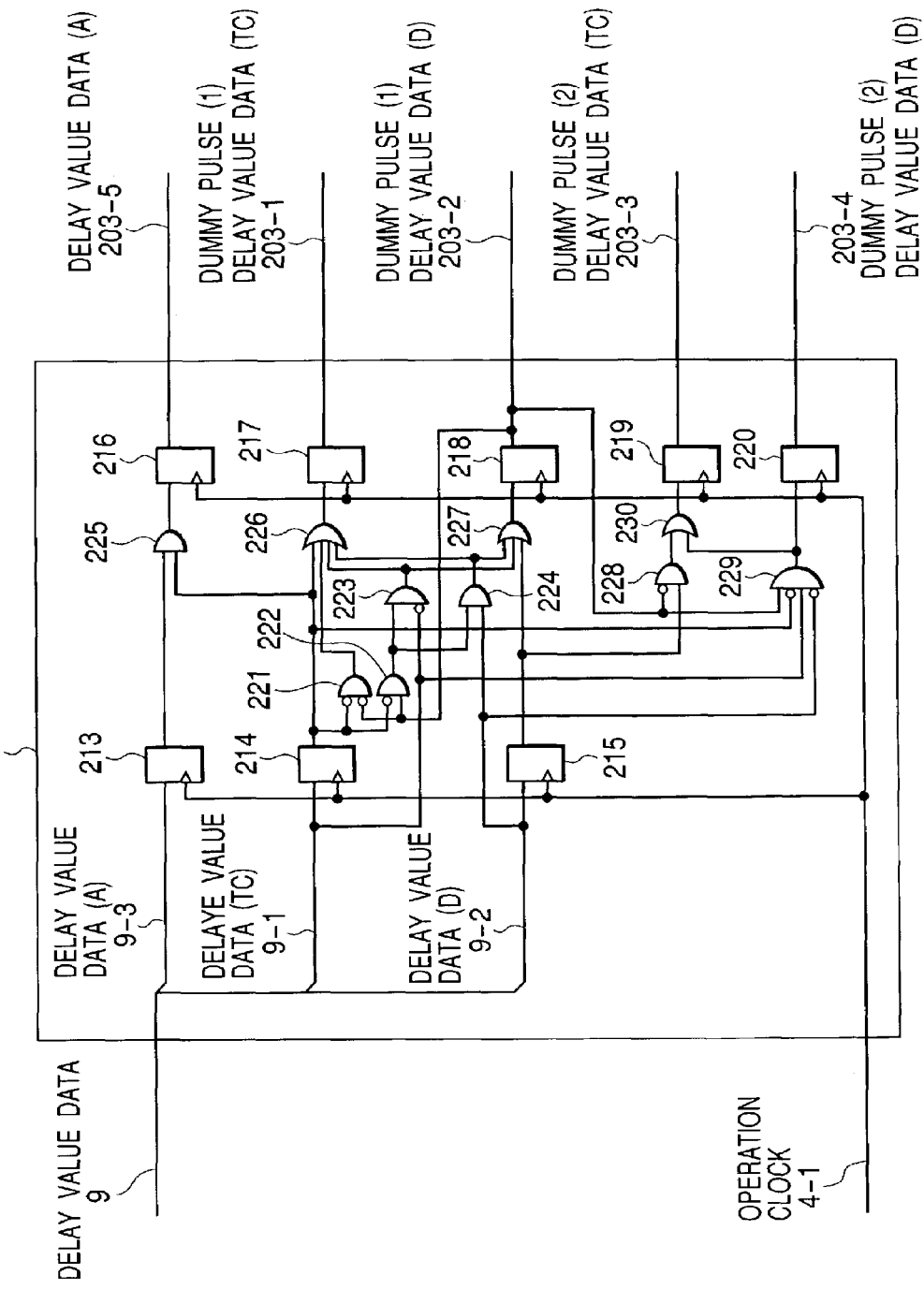
FIG. 8 is a circuit diagram of a dummy pulse control circuit in the second embodiment of the present invention.

The dummy pulse control circuit 203 is duly required to realize the above operations, but the circuit 203 is not limited only to the logical circuit shown in FIG. 8.

Figure 10:
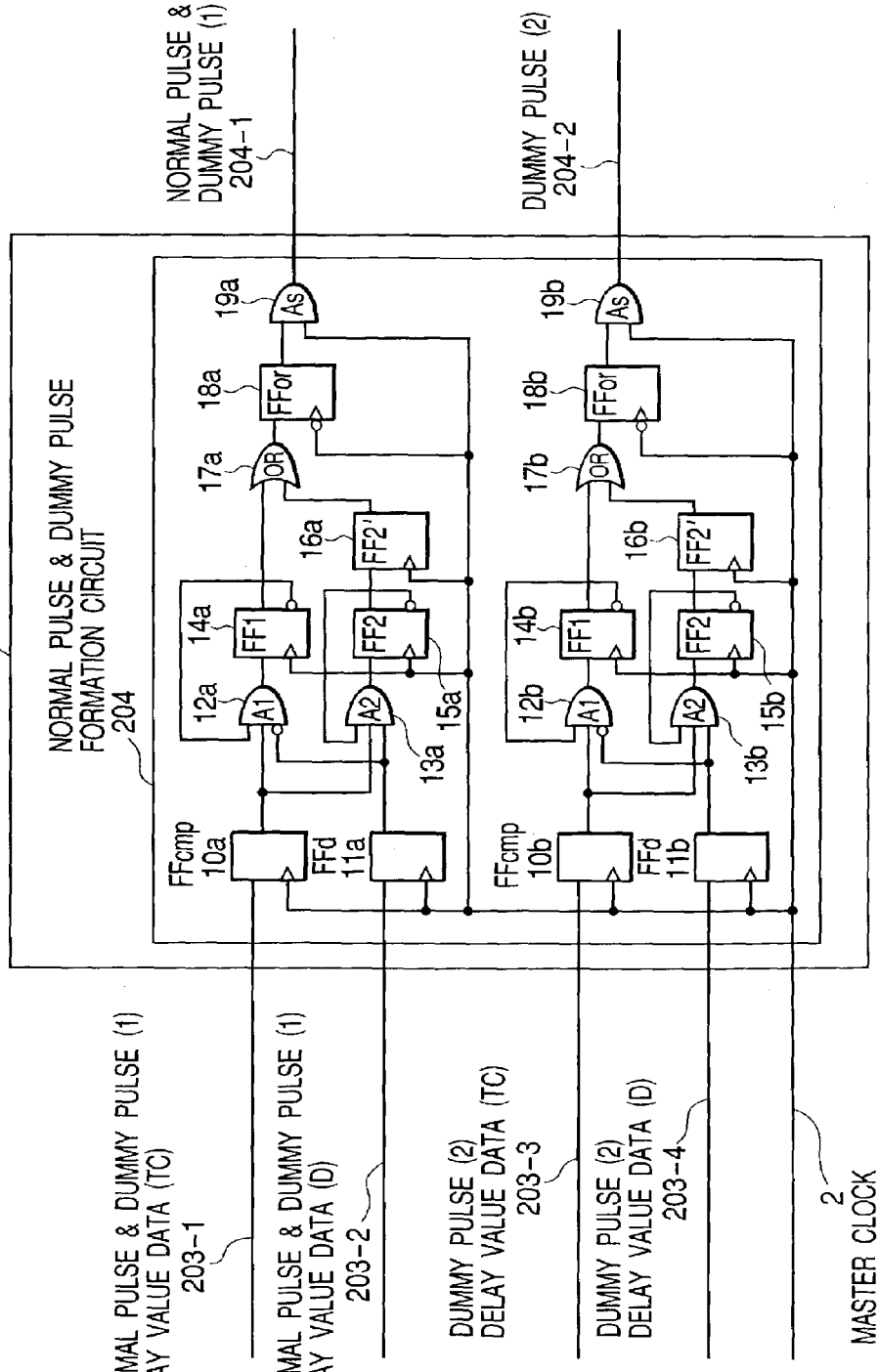
FIG. 10 is a circuit diagram of a pulse formation circuit in the second embodiment of the present invention.
Figure 11:
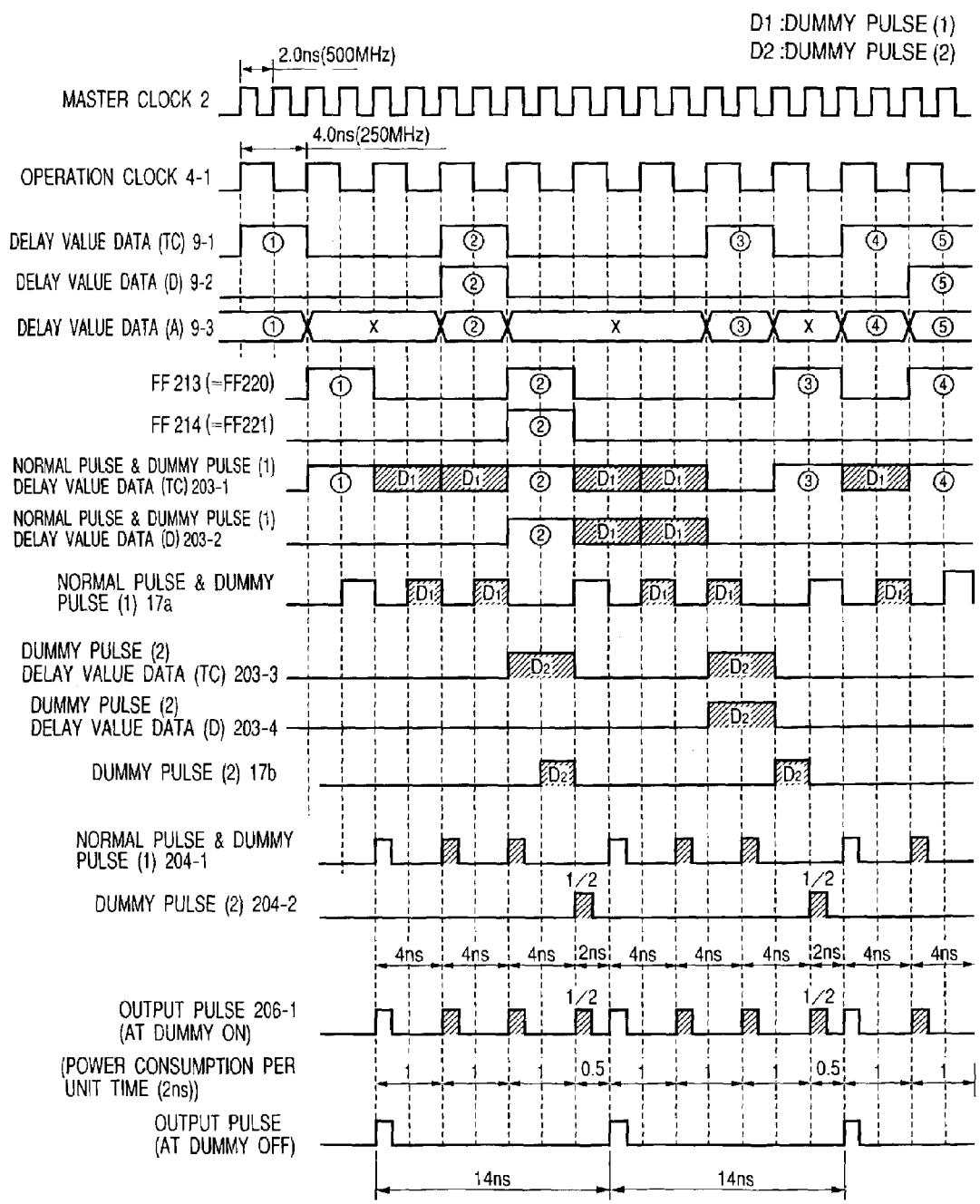
FIG. 11 is a timing chart of each circuit unit shown with respect to the effect of the present invention in the second embodiment of the present invention.
Figure 12A:
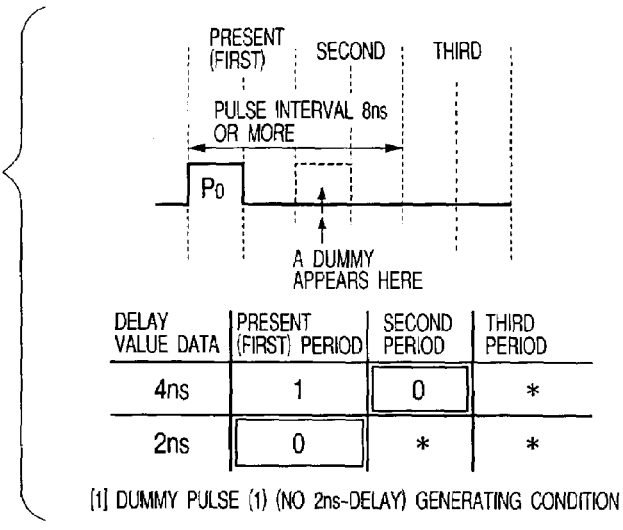
FIG. 12 is charts for describing the conditions of dummy pulse generation in the second embodiment of the present invention.
Figure 12B:
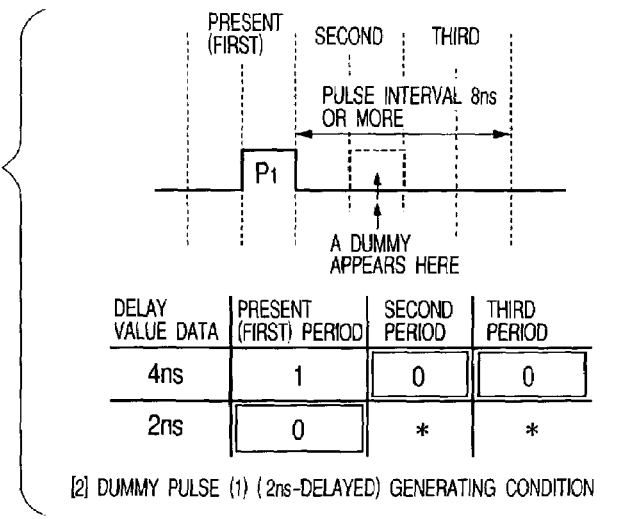
Figure 12C:
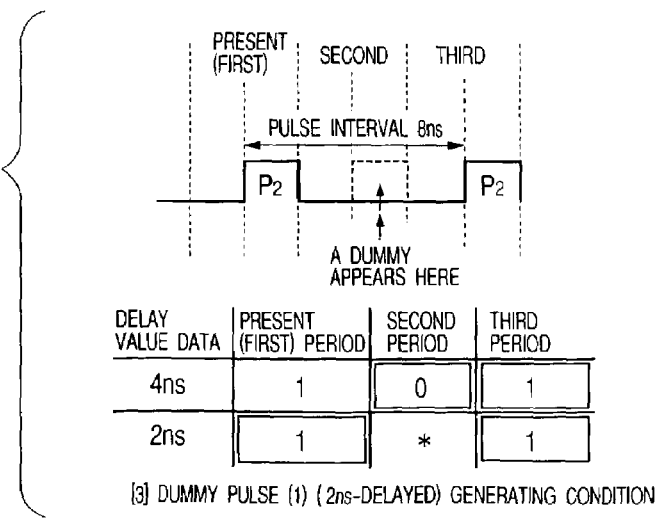
Figure 12D:
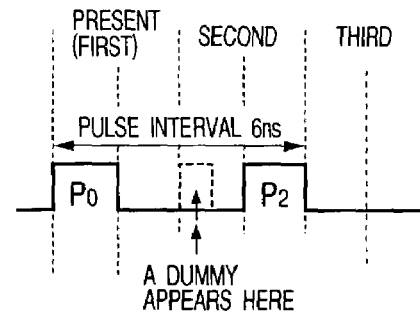
Figure 12E:
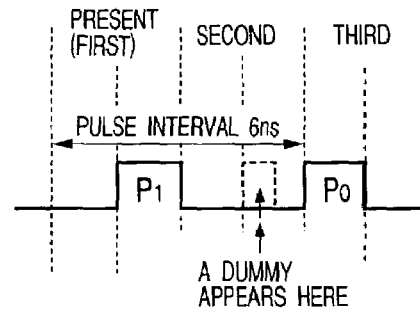

FIG. 10 shows a configuration of the pulse formation circuit 202.

Figure 16:
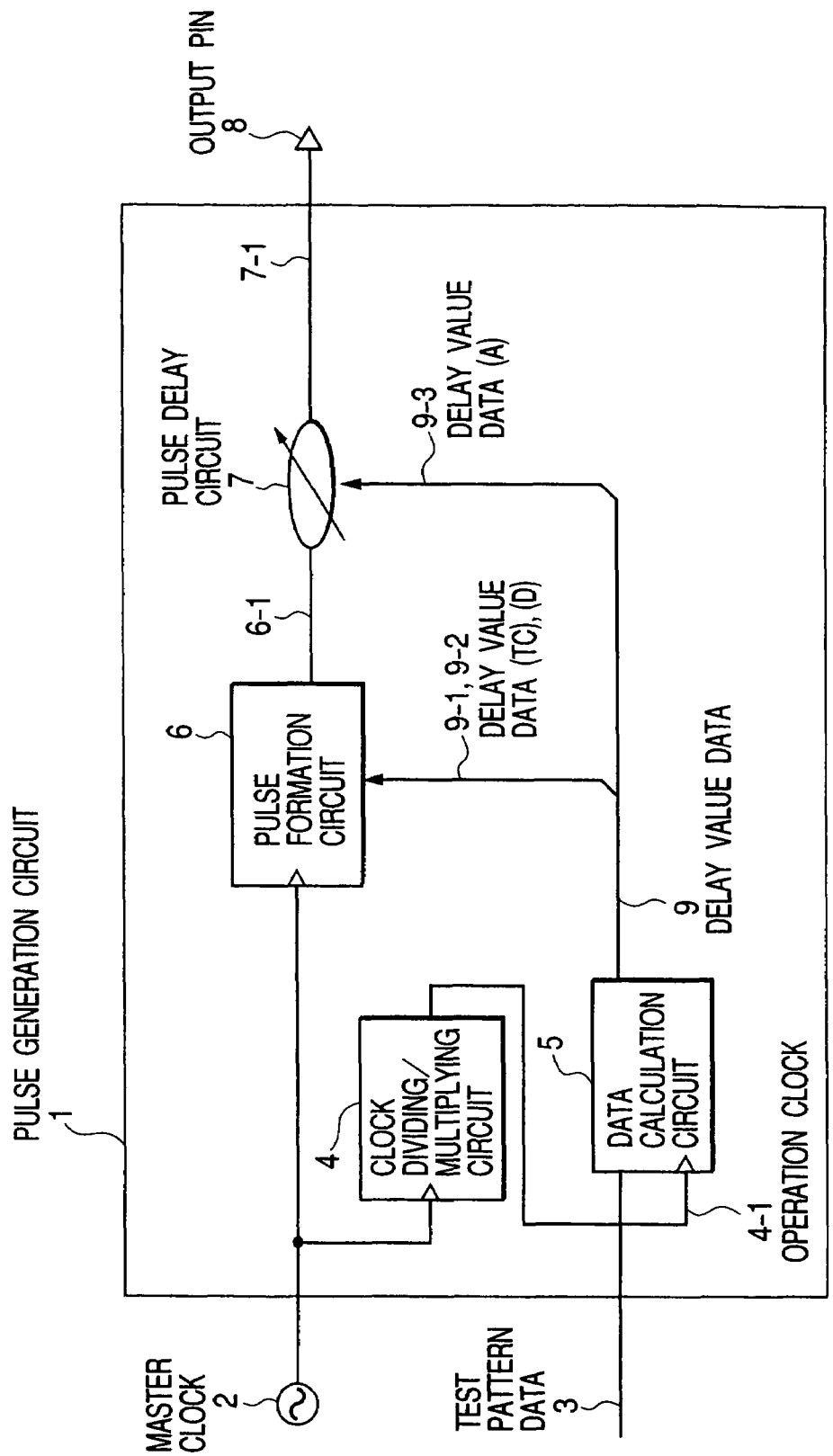
FIG. 16 is a schematic circuit diagram of a conventional pulse generation circuit.
Figure 17:
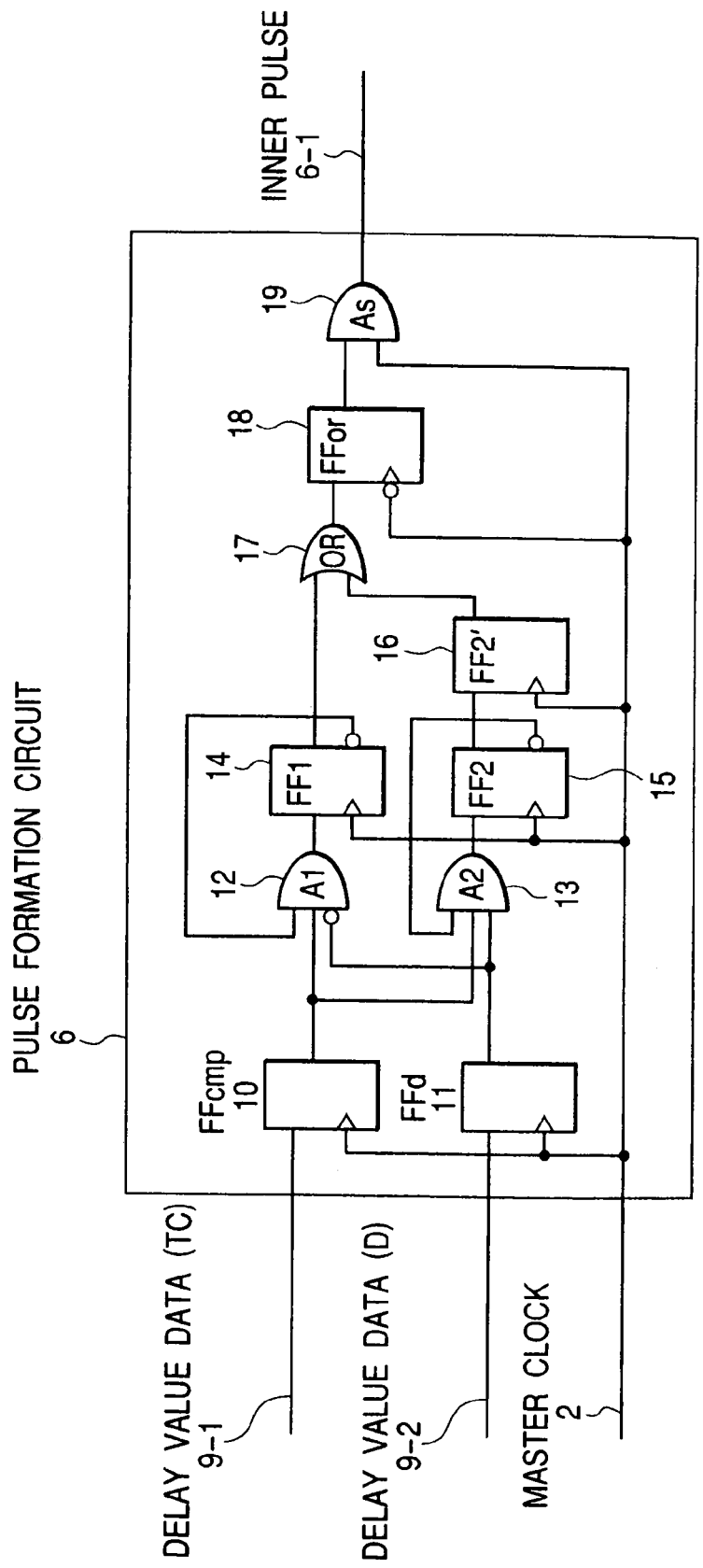
FIG. 17 is a circuit diagram of a pulse formation circuit provided in a conventional pulse generation circuit.
Figure 18:
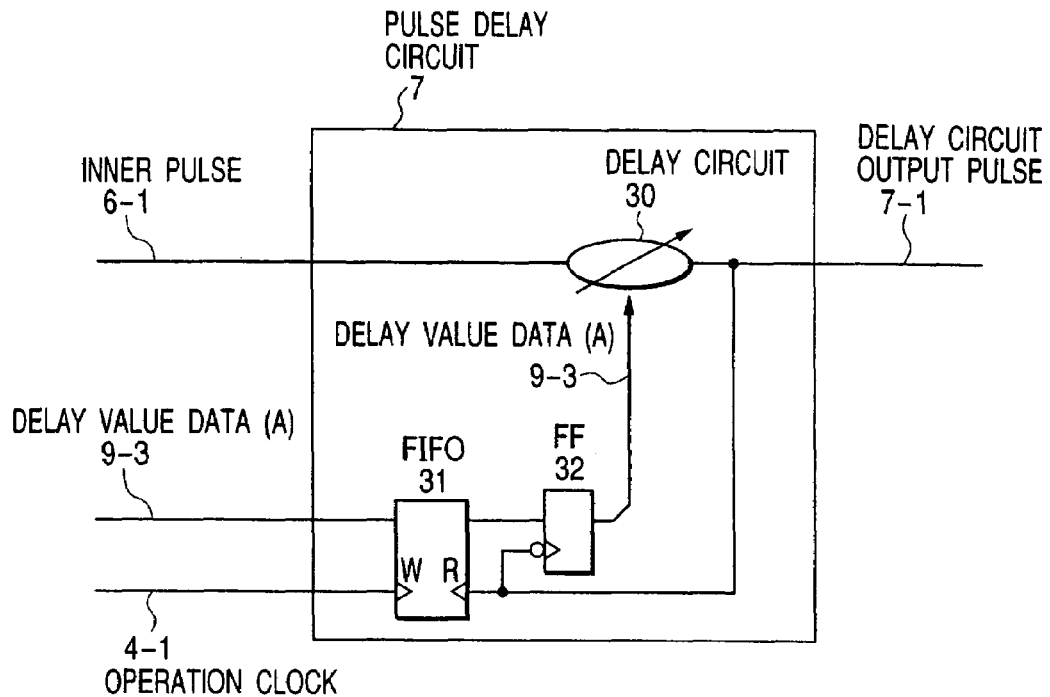
FIG. 18 is a circuit diagram of a pulse delay circuit provided in the conventional pulse generation circuit.

The pulse formation circuit 202 receives delay value data of both normal pulse and dummy pulse (1), as well as the delay value data of the dummy pulse (2) from the dummy pulse control circuit 203 to generate normal and dummy pulses (1) and the dummy pulses (2). The operation of the pulse formation circuit 202 itself is the same as that of the pulse formation circuit 6 shown in FIG. 16. This is why the pulse formation circuit 202 can generate pulses according to the TC and D delay value data.

In this embodiment as described above, therefore, the second dummy pulse having adjusted power consumption can be generated even in a time band in which the power consumption cannot be compensated by pulse controlling per operation clock cycle (operation clock unit time), thereby the power consumption of the pulse generation circuit can be kept fixedly.

Furthermore, because the power consumption of the pulse generation circuit 201 can be kept fixedly as described above, both voltage variation and temperature changes in the generation circuit 201 can be suppressed, thereby such a new pulse generation circuit in which the pulse generation time accuracy is more improved is provided.

Third Embodiment

Next, the third embodiment of the present invention will be described.

The pulse delay circuit 104 located in the pulse generation circuit 101 can delay pulses generated from the pulse formation circuit 102 by a slight time under the master clock cycle according to the delay value data (A) 103-3. The configuration and operation of the conventional pulse delay circuit 104 are as shown in FIG. 4.

Figure 13:
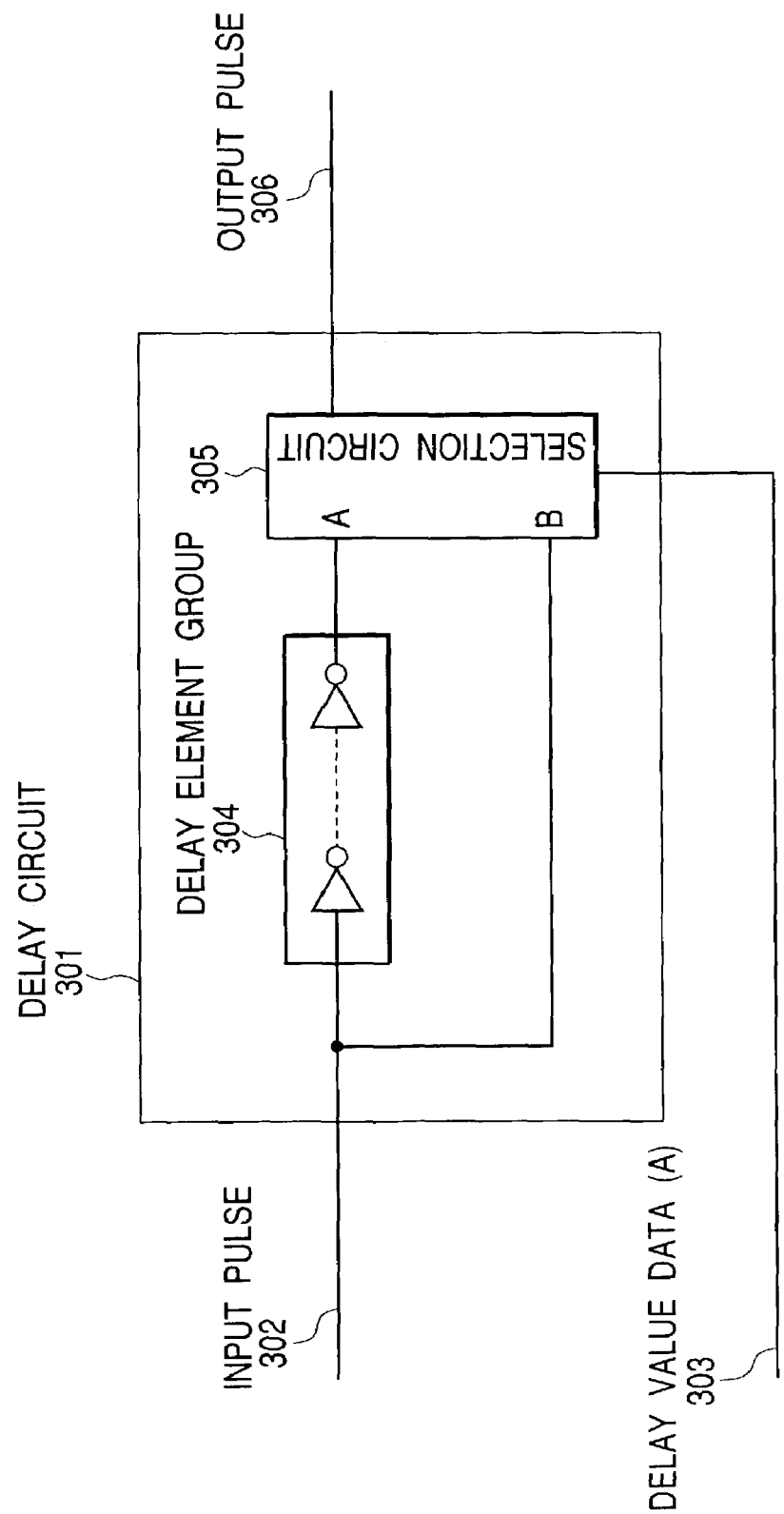
FIG. 13 is a circuit diagram of a delay circuit in the third embodiment of the present invention.

Next, the configuration of the delay circuit 301 in this embodiment will be described with reference to FIG. 13.

The delay circuit 301 is configured by a delay element group 304 composed of at least more than one such delay element group as inverters, etc.; at least two or more delay paths having different number of elements (=pulse propagation delay times) included in the delay element group 304; and a selection circuit 305 disposed in the rear stage of the delay element group 304 and used to select a delay path.

Consequently, in this delay circuit, the power consumption is kept fixedly regardless of the delay path selected by the delay value data (A) 303, since the input pulse 302 comes to pass all the delay element group of all the paths.

When such the delay circuit 301 in which the power consumption is kept fixedly regardless of the selected delay path is employed for the pulse delay circuit of the pulse generation circuit 101 described in the first embodiment, it is possible to suppress the variation of the power consumption caused by changes of the set delay time and to keep the power consumption in the pulse generation circuit 101 fixedly, thereby realizing such a more accurate pulse generation circuit.

Fourth Embodiment

Next, a description will be made for the fourth embodiment of the present invention, concretely the operation of the LSI tester 401, that is, a method for testing (inspecting) semiconductor devices.

In this fourth embodiment, a description will be made for the LSI tester 401 that employs the pulse generation circuit 101 described in the first embodiment.

The LSI tester 401 tests the operation of each sample LSI 412 by applying a test waveform 408 to the sample LSI 412 and comparing the response waveform 409 returned from the sample LISI 412 with a predetermined expectation value to determine the defect/non-defect of the LSI 412.

The LSI tester 401 is mainly configured by a pattern formation circuit 402 for generating a test waveform and test pattern data 404; a timing generation circuit 406 for generating a test waveform 408 according to the test pattern; a driver 410 for adjusting the amplitude of the test waveform 408; an analog comparison circuit 411 for determining the voltage (L/H) of the response waveform 409; a fail memory 403 for storing determination results; a CPU 407 for controlling each of those circuits; and a master clock circuit 2 for driving the LSI tester 401.

Figure 14:
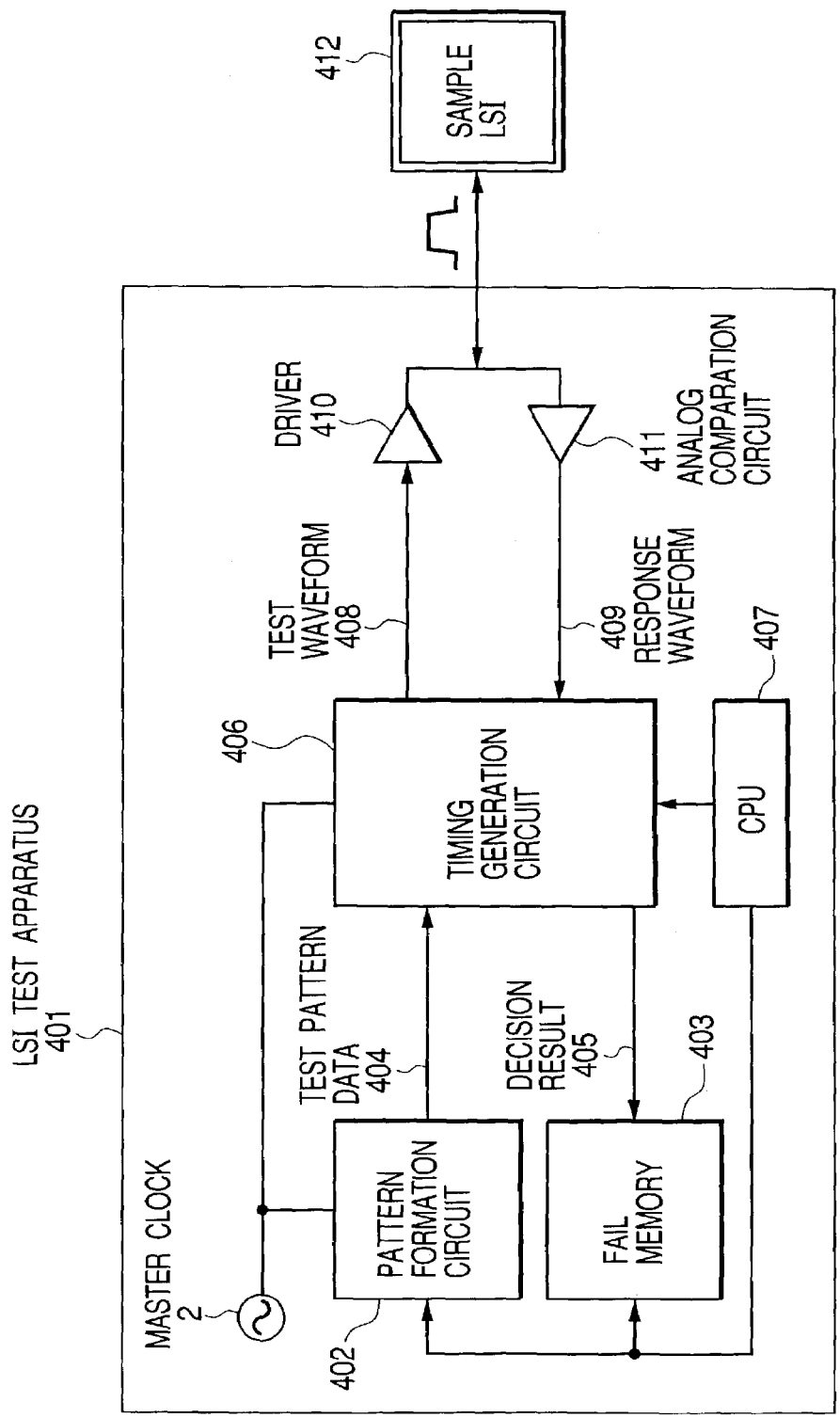
FIG. 14 is a block diagram of an LSI tester in the fourth embodiment of the present invention.
Figure 15:
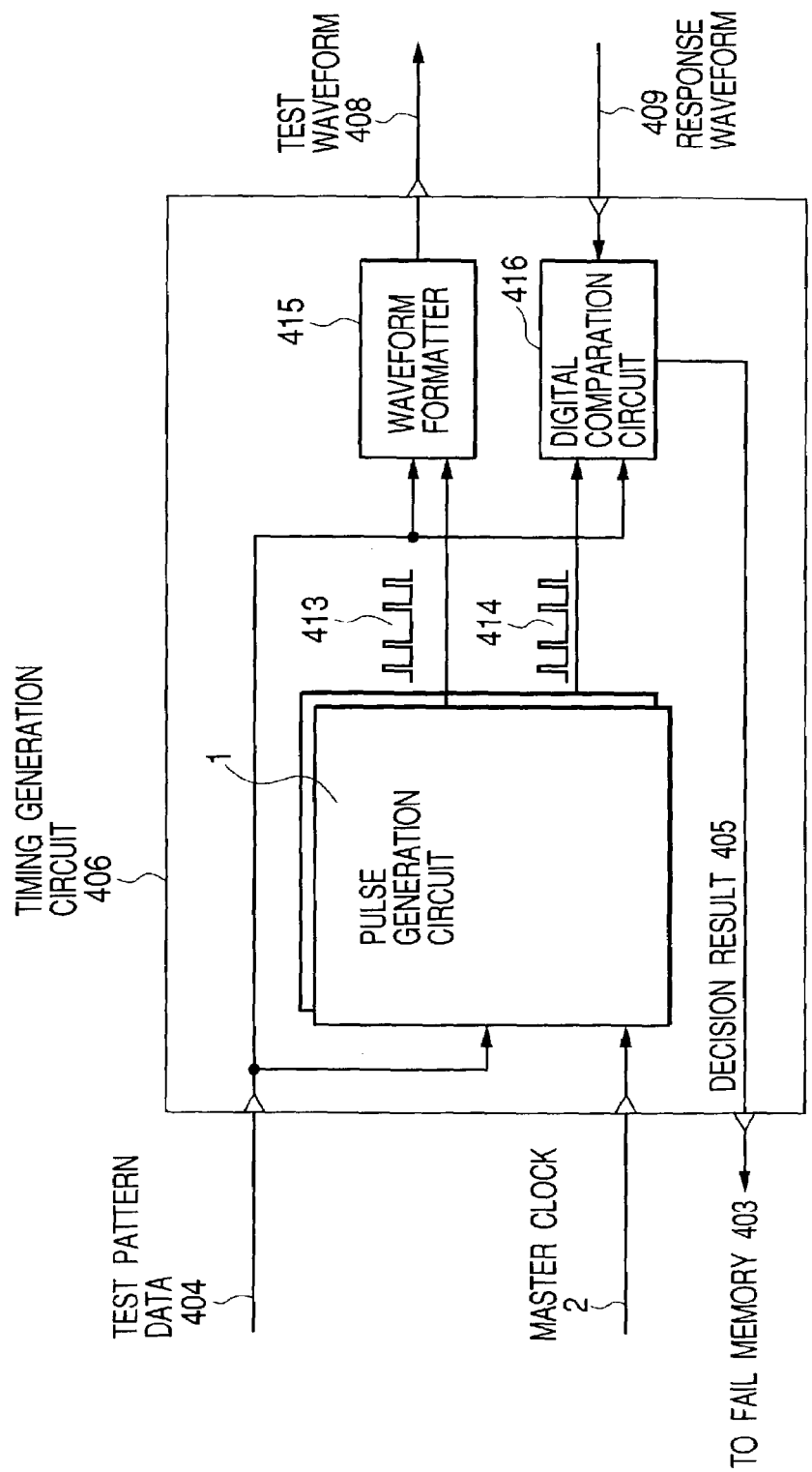
FIG. 15 is a block diagram of a pulse generation circuit provided in the LSI tester in the fourth embodiment of the present invention.

FIG. 14 shows a block diagram of an IC tester and FIG. 15 shows a block diagram of the timing generation circuit.

The pattern formation circuit 402 generates test pattern data 404 (pattern data) that includes such information as a test waveform and an-expectation value.

The timing generation circuit 406 receives a master clock from the master clock circuit 2 and test pattern data 404 from the pattern formation circuit 402 to generate a timing edge (=pulse) 413 for denoting a rising/falling timing of the test waveform 408 and a timing edge (=pulse) 414 for denoting a rising/falling timing of the strobe pulse used to determine the determination timing of the waveform 409 in the built-in pulse generation circuit 1. In this embodiment, the timing generation circuit 406, as shown in FIG. 15, includes a pulse generation circuit 1; a wave formatter 415; and a digital comparison circuit 416.

Receiving the test wave timing edge 413 for denoting the rising/falling timing of the test waveform 408, the waveform formatter 415 forms a test waveform (converts the test waveform) from the timing edge 413 according to the test pattern data 404 received from the pattern formation circuit 402 and outputs the result to the driver 410 as a test waveform 408.

The driver 410 adjusts both reference voltage and amplitude of the test waveform 408 output from the waveform formatter 415 and applies them to the sample LSI 412.

The analog comparison circuit 411 determines the logical voltage (L/H) of the response waveform 409 returned from the sample LSI.

When the determined voltage is satisfied, the digital comparison circuit 416 located in the timing generation circuit 406 compares the determined voltage with the expectation value received from the pattern formation circuit 402. When the comparison result is "not match", the LSI is determined to be defective and the defective determination is written in the fail memory 403.

In the LSI tester 401, the test performance depends significantly on the accuracy of the test waveform generation timing. Especially, the timing edge generated by the pulse generation circuit 1 is required of very high timing accuracy.

In this fourth embodiment, a pulse generation circuit described in the above embodiment is used in the LSI tester 401, so that the variation of the power consumption in the pulse generation circuit is suppressed to reduce the variation of the pulse generation timing to be caused by temperature changes. Consequently, this embodiment can realize such an LSI tester that can generate accurately controlled test waveforms. In addition, the LSI tester power consumption can be stabilized while the circuit is kept in the small scale, thereby it can cope with multiple outputs (multiple pins) of the LSI tester 401, which is indispensable for testing high performance LSIs.

Fifth Embodiment

Finally, the fifth embodiment of the present invention will be described, concretely methods for testing and manufacturing semiconductor devices with use of the test waveform received from the semiconductor tester described in the above embodiment.

Figure 22:
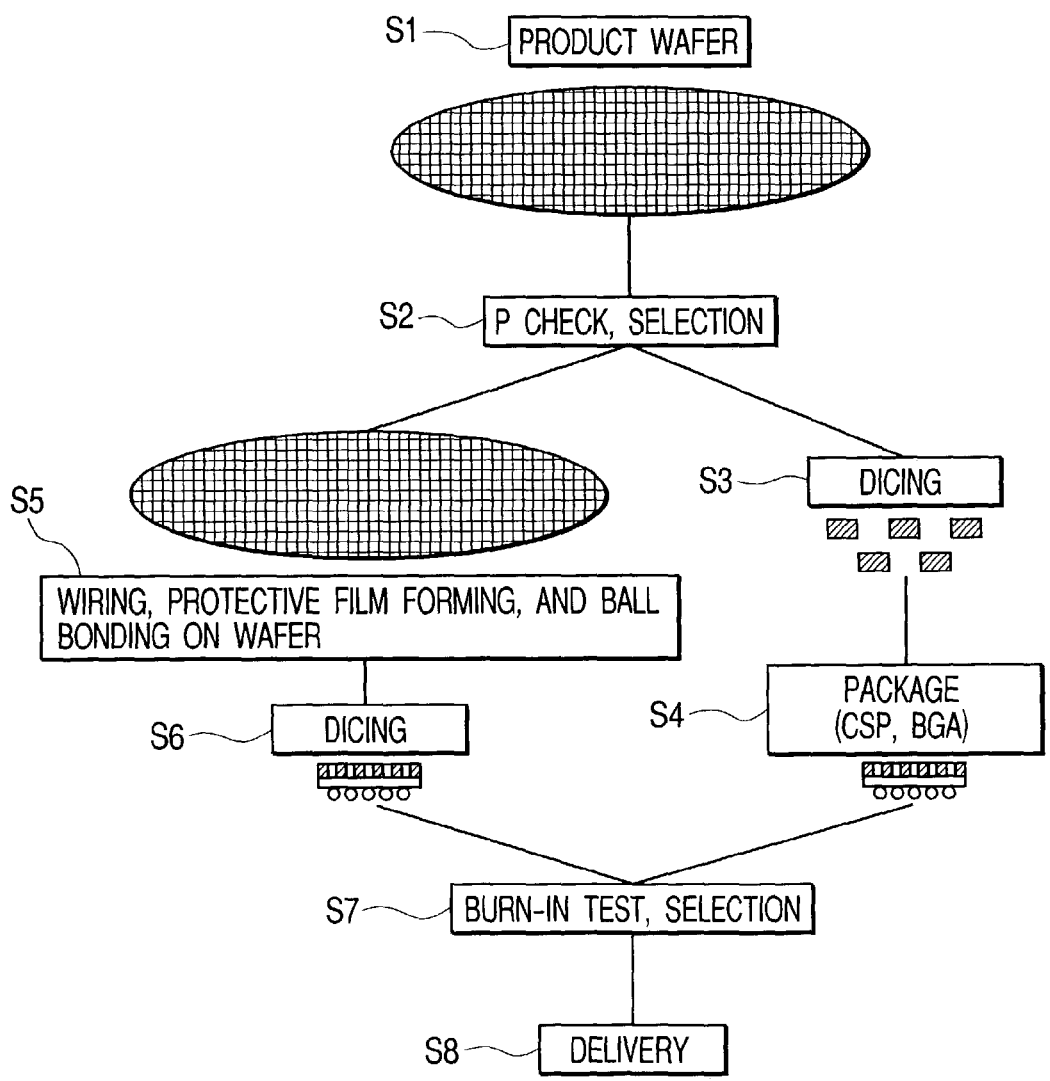
FIG. 22 is a chart for describing the manufacturing processes of semiconductor devices.

FIG. 22 shows a flowchart of the method for manufacturing semiconductor devices inspected with use of the test waveform generated in the above embodiment, then to be delivered. In FIG. 22, a product wafer manufactured in step S1 is checked for defect/non-defect in the P (Pellet) inspection in step S2. Selected non-defective wafers go to step S3 or S5 under such the conditions as the manufacturing equipment, etc.

In step S3, the product wafer is diced and only the non-defective chips are packaged into CSP (Chip Size Package), BGA (Ball Grid Array), etc. in step S4. Control then goes to step S7.

In step S5, wiring patterns and protective films are formed collectively on the wafer, which is then subjected to the solder-bonding. After this, the wafer is diced into chips. Control then goes to step S7.

In step S7, the semiconductor device testing method of the present invention is carried out for the semiconductor devices (chips). In other words, diced chip products (semiconductor devices) in the final shape are subjected to a burn-in test and the final selection process. And, chip products determined to be non-defective in the final stage are delivered in step S8.

In this fifth embodiment, the inspection in steps S2 and S7 shown in FIG. 22 is carried out with use of the test waveform received from the semiconductor tester described in the above embodiment. It is thus possible to inspect high performance semiconductor devices (LSIs) with use of a test waveform of which timing is accurately controlled to manufacture semiconductor devices.

While a description has been made for the present invention concretely with reference to the preferred embodiments, the embodiments of the present invention are not limited only to them; it is to be understood that modifications will be apparent to those skilled in the art without departing the spirit of the invention.

Sixth Embodiment

Figure 23:
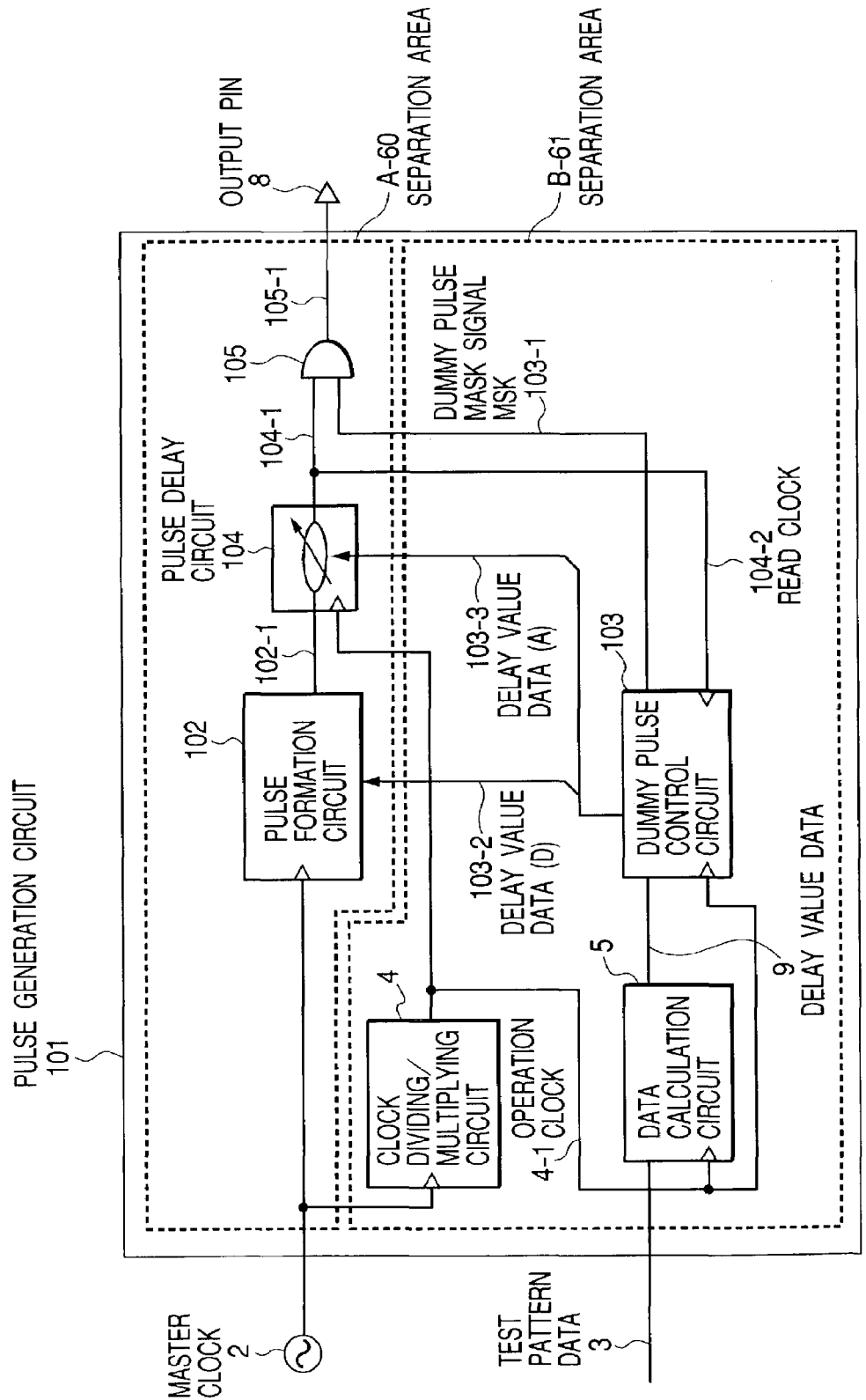
FIG. 23 is a block diagram of a pulse generation circuit 101 in the sixth embodiment of the present invention.

Referring now to FIG. 23, the sixth embodiment of the present invention will be described as follows. An operation of a function block constituting a pulse generation circuit 101 of this embodiment is the same as that shown in FIG. 1.

It is an object of this embodiment in a pulse generation circuit mounted on a circuit substrate or a multiple-chip module or an LSI chip to restrict transmittance of a power supply noise and to improve a pulse generating accuracy by a method wherein a power supply and a ground (this is sometimes a power supply system) are separated from each other by a group of circuits A-60 including a path through which a pulse outputted from the pulse formation circuit 102, passes and an group of circuits other than the former B-61 (excepted the group of circuits A-60) in the pulse generation circuit 101.

In the case that the power supply and the ground are separated within the circuit substrate or within the multiple-chip module or the LSI chip and the group of circuits including the path through which the pulse passes is applied as a separating region (a separation area) A-60 and the group of circuits other than the former is applied as a separating region (a separation area) B-61, the power supply noise generated under an operation of the circuit in the separating region B-61 can be restricted from being transmitted to the separating region A-60 acting as the pulse passing path, so that it is possible to restrict a deterioration of accuracy of a pulse generating time by the power supply noise.

It is preferable that the separated power supply and the ground are ideally separated in a complete manner as another power supply. As another method for it, it is connected outside a pulse generator (outside an LSI chip) through a bypass capacitor, thereby it is possible to reduce entering of the power supply noise from the separating region B into the separating region A.

Further, the aforesaid separation of the power supply is one example in the embodiment and so it may also be applicable to realize the same effect as that described above by applying a design in which a characteristic impedance in the power supply and the ground between separating regions A and B becomes high.

Further, a separation of the power supply regions in the LSI chip and the like provides an effect that a high integration becomes possible.

It is of course apparent that the present embodiment can be applied to the aforesaid first to the fifth embodiments and the aforesaid effect can be attained.

Seventh embodiment

Figure 24:
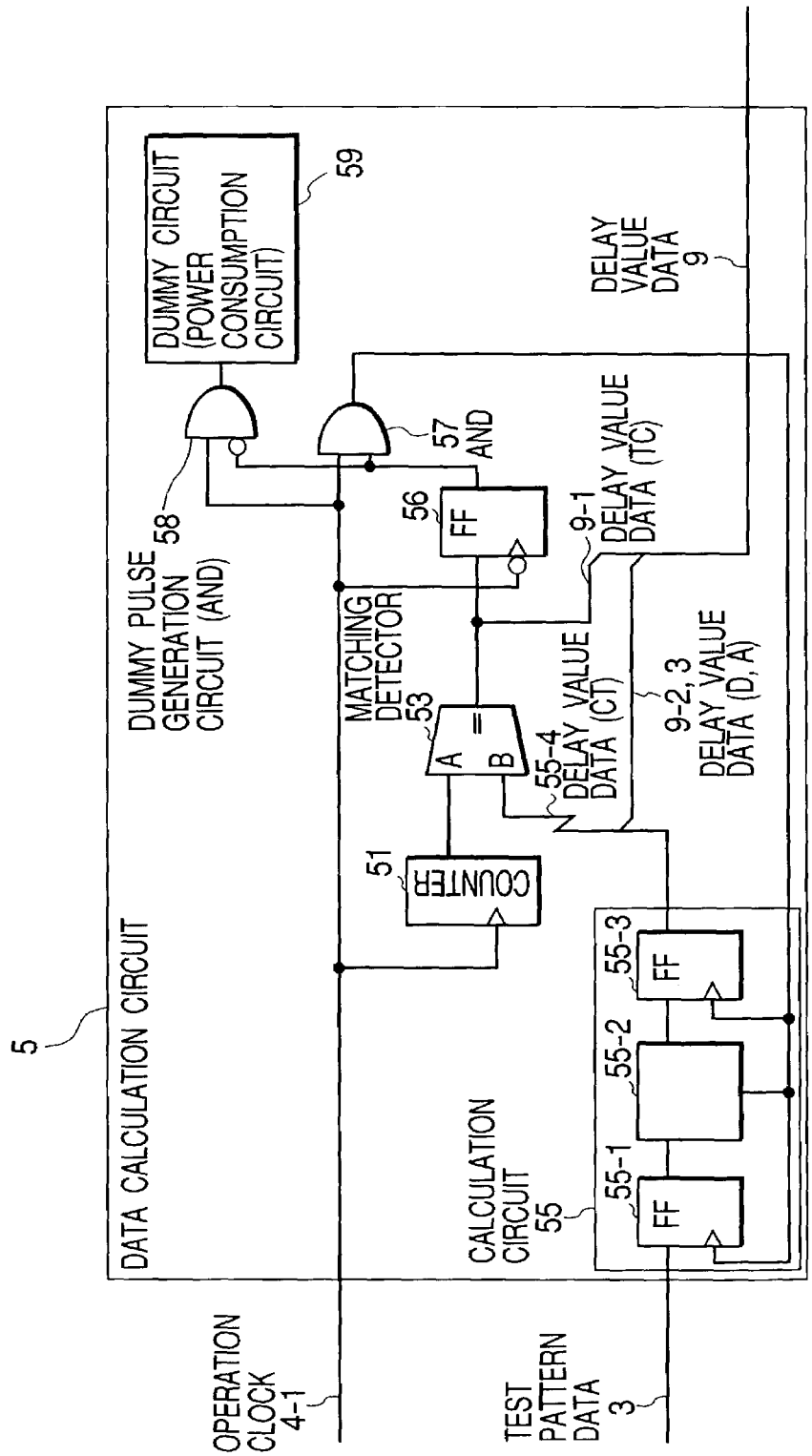
FIG. 24 is a block diagram of a pulse generation circuit 101 in the seventh embodiment of the present invention.

Subsequently, referring to FIG. 24, one example of configuration of a data calculation circuit 5 illustrated in FIG. 23 will be described. It is an object of the present embodiment to reduce the power supply noise generated from the separating region B-61 illustrated in FIG. 23.

This embodiment is constituted such that a dummy pulse generation circuit and a dummy circuit (a power consumption circuit) are applied in the data calculation circuit. In order to keep a power consumption in the circuit not operated under a cycle of the operation clock 4-1 constant, it is possible to stabilize more the entire power consumption of the pulse generation circuit and improve a time accuracy of occurrence of pulse by detecting a time in which the original pulse is not generated, operating the separately prepared dummy circuit under that cycle and consuming the electrical power.

This data calculation circuit 5 is constituted by a counter 51 for counting an operation clock; FF 52 for latching delay data from a timing data calculation circuit 55; a coincidence detector 53 for comparing an output of the counter with an output delay value data (TC) from FF 52 and outputting a coincidence signal (a pulse generating signal) when they are coincided to each other; FF 56 for latching the coincidence signal; AND 57 for attaining AND for coincidence signal with operation clock 4-1; a dummy pulse generation circuit (AND) 58; and a dummy circuit (a power consumption circuit) 59.

In this circuit, a coincidence signal (a pulse generating signal) is reversed in the dummy pulse generation circuit (AND) 58 to attain OR with the operation clock 4-1 and generate a dummy pulse at a cycle in which the pulse is not originally generated.

In addition, the dummy circuit 59 having a dummy power consumption circuit is constituted by a clock buffer and the like and further it has a circuit size (a power consumption) approximately equal to that of a circuit not operated under an operation clock cycle of the original pulse generator.

Accordingly, the dummy circuit 59 can keep a power consumption in the pulse generation circuit constant by consuming an electrical power equal to that generated at the time of occurrence of pulse with the inputted dummy pulse under a cycle in which any pulse is not originally generated.

In addition, it is also applicable that the dummy circuit 59 is constituted such that there is provided means for changing-over a passing path of the inputted dummy pulse to enable a consumed electrical power to be adjusted.

Eighth Embodiment

Next, referring to FIG. 25, another embodiment of the data calculation circuit 5 for use in attaining an effect similar to that of the seventh embodiment will be described.

Figure 25:
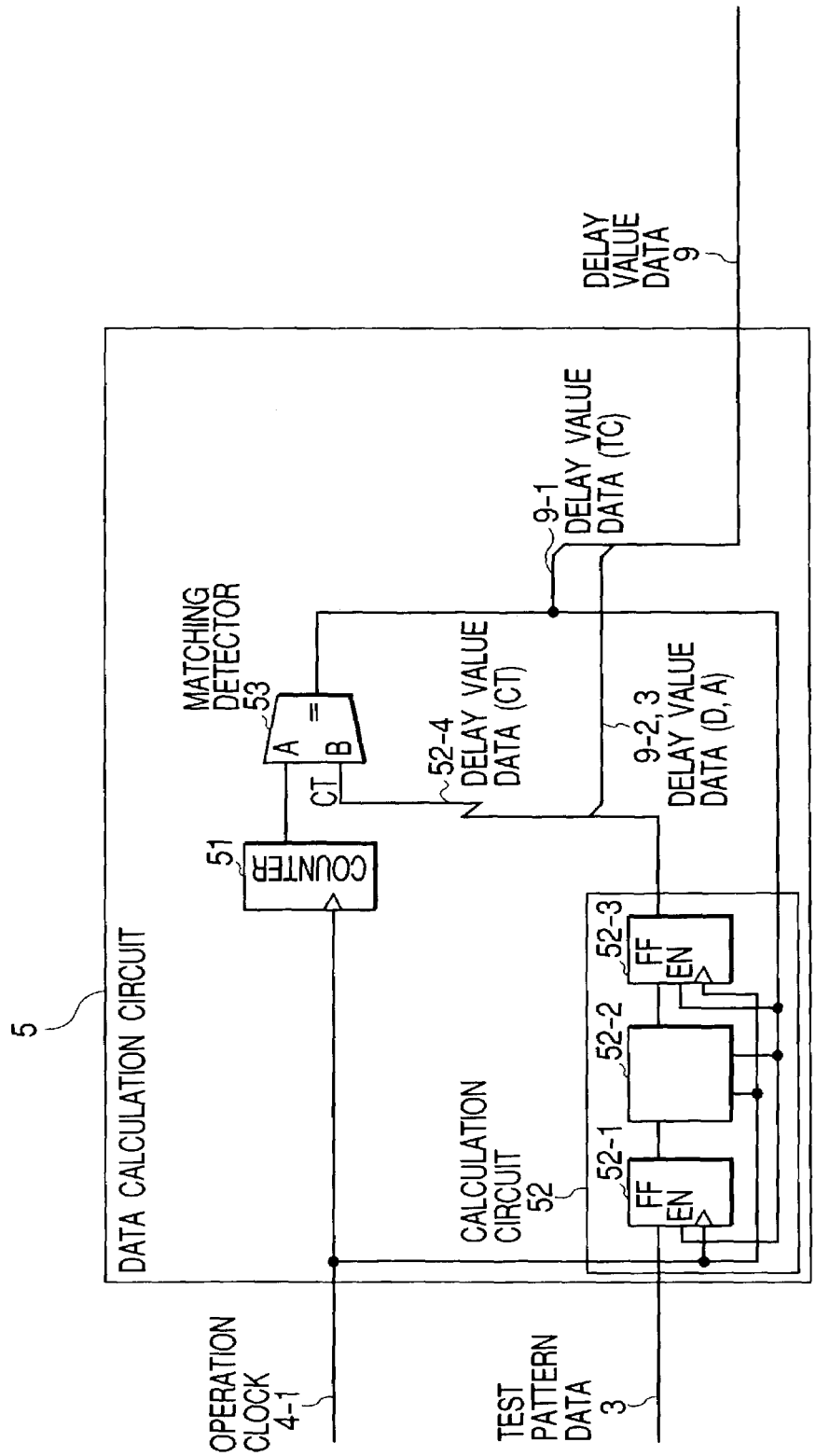
FIG. 25 is a block diagram of a pulse generation circuit 101 in the eighth embodiment of the present invention.

The data calculation circuit 5 shown in FIG. 25 is constituted by a counter 51 for counting an operation clock; a coincidence detector 53 for comparing an output of the counter 51 with an output delay value data (CT) 52-4 from the calculation circuit 52 and outputting a coincidence signal when they are coincided to each other; and an calculation circuit 52 for enabling the coincidence signal from the coincidence detector 53 to be acted and generating a delay value data 52-4 and delay value data 9-2, 9-3 in synchronous with the operation clock 4-1. Further, the calculation circuit 52 in this embodiment is comprised of FF 52-1, 52-3 and a group of circuit 52-2 constituted by FF and a combination circuit. The FF used herein takes the data signal (D) inputted at present by the enable signal (EN).

Figure 26:
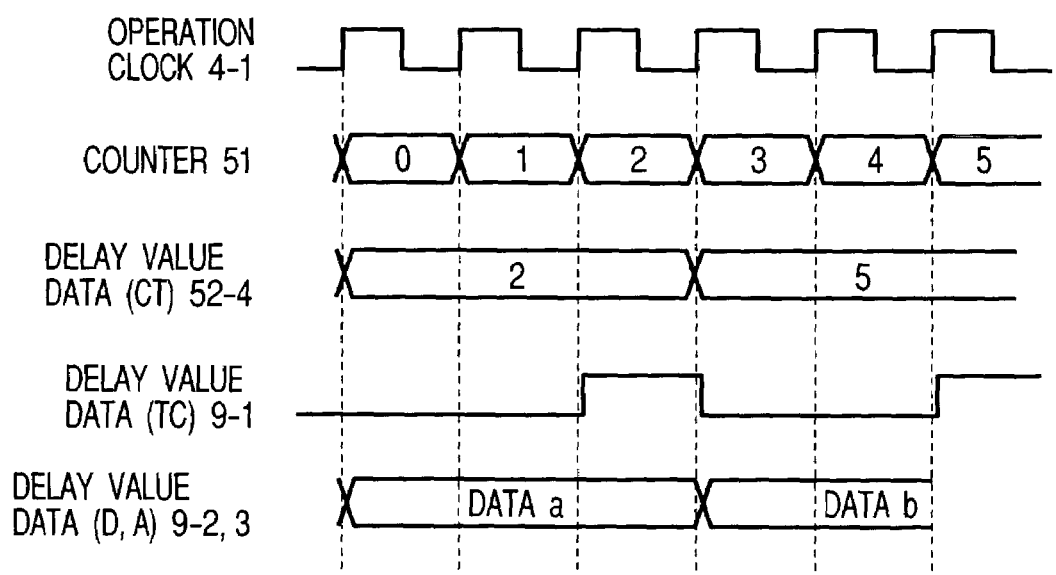
FIG. 26 is an operation chart of the eighth embodiment of the present invention.

FIG. 26 shows an operating chart of the data calculation circuit 5 and this chart indicates a counter operated in synchronous with the operation clock 4-1, delay value data 52-4, 9-2, 9-3 which are outputs from the calculation circuit 52, and an output 9-1 of the coincidence detector 53. The calculation circuit 5 performs a predetermined calculation with data got from the test pattern data 3 and outputs delay value data 52-4 ("2") and 9-2, 9-3 (data a). The delay value data 52-4 is compared in sequence with an output got from the counter 51 by the coincidence detector circuit and a coincidence signal ("High" level) is outputted when a counted value is "2". At the calculation circuit 52, a calculation for generating a subsequent delay value data is carried out with this coincidence signal and then the delay value data 52-4 ("5") and the delay value data 9-2, 9-3 (data b) are outputted. Subsequently, the delay value data is generated in sequence at the calculation circuit 52.

In this case, since the FF in the calculation circuit 52 is always operated with the operation clock, an electric current is always consumed at an operating part because the operation clock is inputted to the FF. With such an arrangement as above, it is possible to reduce an increased or decr5eased amount of electrical consumption between one cycle in which the delay value data (TC) is generated and the other cycle in which the delay value data (TC) is not generated.

That is, even in the case that no calculation of data is required in the calculation circuit 52, the electrical current is consumed at the FF to cause an increased or decreased state of the consumption current acting as a factor of generating noise voltage to be decreased.

Further, it is of course apparent that the data calculation circuits described in the seventh and eighth embodiments are combined with at least any one of the other embodiments 1 to 6 to enable a pulse generator having an improved pulse generating time accuracy to be provided.

Further, the examples described in the seventh and eighth embodiments are quite effective in the case of configuration in which the separating regions A and B of the pulse generation circuit 101 described in reference to FIG. 23 are realized by one semiconductor chip and a circuit having the same power supply or ground as those above is used.

Figure 21:
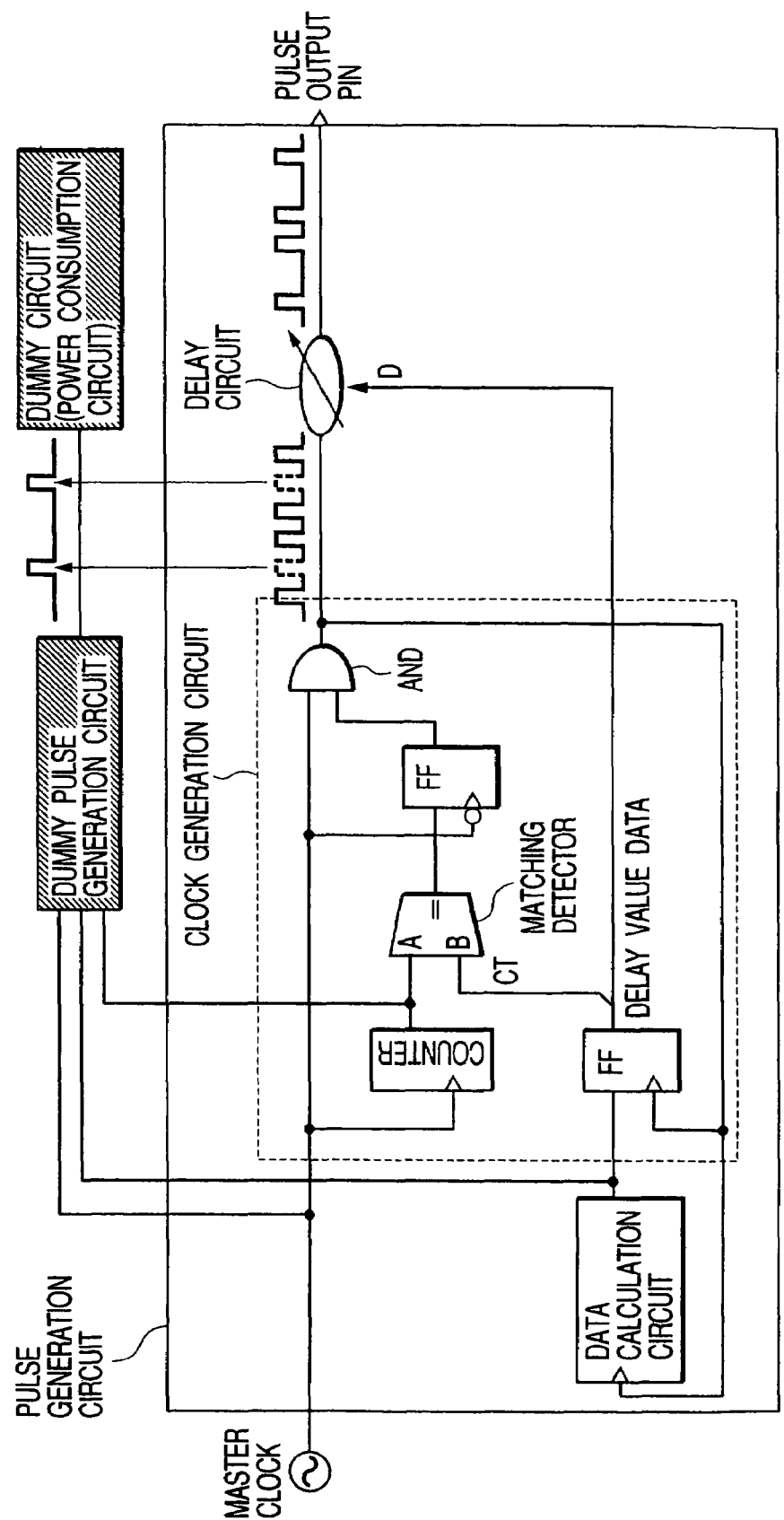
FIG. 21 is a block diagram of a conventional pulse generation circuit.

In addition, it is also of course apparent that it is possible to increase an accuracy of a pulse generating time by applying the data calculation circuit described in the seventh and eighth embodiments, as shown in FIG. 21, to a pulse generation circuit having a power consumption circuit (a dummy circuit) separately arranged for keeping a power consumption during operation of the pulse generation circuit constant in separate from the delay circuit of the pulse generation circuit.

The calculation circuits 52, 55 are characterized to have a circuit in which a consumption current is kept constant, and a power consumption (a circuit junction temperature) varied in response to the consumption current and a reduction in a power supply voltage caused by a variation in current can be attained. Accordingly, it is of course apparent that an calculation circuit capable of attaining a similar effect is in a range of the present embodiment even if the calculation circuit is out of a logic circuit described in reference to the calculation circuits 52, 55.

Although the invention invented by the present inventor has been described practically in reference to its embodiments above, it is of course apparent that the present invention is not restricted to the aforesaid embodiments, but it can be modified in many forms without departing from its scope or gist.

Some effects attained by a typical invention disclosed in the present inventions are described in brief as follows.

(1) Since a power consumption of the pulse generation circuit per unit time can be kept constant (stable), a temperature variation in the pulse generation circuit can be restricted, a transmittance delay time error (dispersion) in the delay circuit can be reduced and a high precision pulse generation circuit can be realized. In addition, even if a set delay amount is varied, a pulse delay circuit not varying a power consumption is combined with it, so that it becomes possible to keep a power consumption of the pulse generation circuit constant.

(2) It is possible to provide an LSI tester which can apply a test waveform having its high accurately controlled timing (time).

(3) A test waveform having its high accurately controlled timing (time) enables a semiconductor device (LSI) showing a high speed operation to be inspected and further enables a semiconductor device to be manufactured.

What is claimed is:

1. A pulse generation circuit comprising:
   a pulse formation circuit for generating pulses;
   a dummy pulse control circuit for controlling generation of a dummy pulse in a no-pulse-generation cycle from the pulse formation circuit by detecting said no-pulse-generation cycle from pattern data that has information for determining whether to generate pulses from the pulse formation circuit;
   a logical gate circuit for eliminating said dummy pulse generated from said pulse formation circuit.

2. The pulse generation circuit according to claim 1, wherein further comprising a pulse delay circuit for delaying the pulses generated from the pulse formation circuit, and said dummy pulse control circuit detects a delay given to said dummy pulse generated from the pulse formation circuit and outputs a signal for eliminating said dummy pulse generated from said pulse formation circuit according to said detected result to the logical gate circuit.

3. The pulse generation circuit according to claim 1, wherein further comprising a pulse delay circuit for delaying the pulses generated from the pulse formation circuit, and the dummy pulse control circuit detects a timing at which dummy pulses generated by the pulse formation circuit passes the pulse delay circuit and outputs a signal for eliminating said dummy pulses generated from said pulse formation circuit according to said detected timing to the logical gate circuit.

4. The pulse generation circuit according to claim 1, wherein said pulse formation circuit can generate a plurality of types of the dummy pulses.

5. The pulse generation circuit according to claim 1, wherein said pulse formation circuit forms a fixed number of pulses in each cycle.

6. The pulse generation circuit according to claim 1, wherein a power source and a ground of a first group of circuits including a path through which the pulses outputted from the pulse formation circuit passes and a power source and a ground of a second group of circuit excepted the first group of circuits are separated in the pulse generation circuit.

7. The pulse generation circuit according to claims 6, wherein the second group of circuits is provided a dummy consumption circuit.

8. A pulse generation circuit comprising:
   a pulse formation circuit for generating normal and dummy pulses according to second delay value data;
   a data calculation circuit for calculating first delay value data being shown a timing at which the pulses are generated from the pulse formation circuit according to pattern data that has information for determining whether to generate pulses from the pulse formation circuit;
   a dummy pulse control circuit for controlling generation of a dummy pulse in a no-pulse-generation cycle from the pulse formation circuit according to the second delay value data obtained by detecting said no-pulse-generation cycle from said first delay value data; and
   a logical gate circuit for eliminating the dummy pulses generated from the pulse formation circuit, being coupled to said pulse formation circuit and said dummy pulse control circuit.

9. The pulse generation circuit according to claim 8, wherein further comprising a pulse delay circuit for delaying the pulses generated from the pulse formation circuit, being disposed between said pulse formation circuit and said logical gate circuit.

10. The pulse generation circuit according to claim 9, wherein said dummy pulse control circuit gives the second delay value data to said pulse formation circuit and third delay value data to said pulse delay circuit, and the delay resolution of said third delay value data is smaller than that of said second delay value data.

11. The pulse generation circuit according to claim 8,
wherein said pulse formation circuit can generate a plurality of types of the dummy pulses.

12. The pulse generation circuit according to claim 8,
wherein said pulse formation circuit forms a fixed number of pulses in each cycle.

13. The pulse generation circuit according to claims 8,
wherein power consumption of said pulse generation circuit is fixed in each cycle.

14. The pulse generation circuit according to claims 8,
wherein a power source and a ground of a first group of circuits including a path through which the pulses outputted from the pulse formation circuit passes and a power source and a ground of a second group of circuit different from the first group of circuits, are separated in the pulse generation circuit.

15. The pulse generation circuit according to claims 14,
wherein the second group of circuits is provided a dummy consumption circuit.

16. The semiconductor tester comprising:
a master clock circuit;
a pattern formation circuit for generating test pattern data that includes information related to a test waveform;
a timing generation circuit for generating the test waveform according to a master clock obtained from the master clock circuit and the test pattern data obtained from the pattern formation circuit;
a driver for applying said test waveform obtained from the timing generation circuit to a sample semiconductor device;
a comparison circuit for judging electric characteristic of the sample semiconductor device in accordance with a response waveform received from the sample semiconductor device;
a fail memory for storing said judging result obtained from the comparison circuit; and
wherein said timing generation circuit includes a pulse generation circuit for generating pulses for determining rising and falling timings of paid test waveform and includes a waveform formatter for forming said test waveform according to said pulses generated by said pulse generation circuit; and
wherein said pulse generation circuit includes a pulse formation circuit for generating pulses and a dummy pulse control circuit for controlling generation of a dummy pulse in a no-pulse-generation cycle from the pulse formation circuit by detecting said no-pulse-generation cycle from the test pattern data that has information for determining whether to generate pulses from the pulse formation circuit and includes a logical gate circuit for eliminating said dummy pulses generated by the pulse formation circuit before outputting pulses to said waveform formatter.

17. A pulse generation circuit comprising:
a pulse formation circuit for generating pulses;
a dummy pulse control circuit for controlling generation of a dummy pulse in a no-pulse-generation cycle from the pulse formation circuit by detecting said no-pulse-generation cycle from pattern data that has information for determining whether to generate pulses from the pulse formation circuit; and
a logical gate circuit for eliminating said dummy pulse generated from said pulse formation circuit,
wherein said dummy pulse control circuit generates a mask signal to eliminate said dummy pulse and outputs the mask signal to the logical gate circuit.

18. A semiconductor tester comprising:
a master clock circuit;
a pattern formation circuit for generating test pattern data that includes information related to a test waveform;
a timing generation circuit for generating the test waveform according to a master clock obtained from the master clock circuit and the test pattern data obtained from the pattern formation circuit;
a driver for applying said test waveform obtained from the timing generation circuit to a sample semiconductor device;
a comparison circuit for judging electric characteristic of the sample semiconductor device in accordance with a response waveform received from the sample semiconductor device;
a fail memory for storing the judging result obtained from the comparison circuit; and
wherein said timing generation circuit includes a pulse generation circuit for generating pulses for determining rising and falling timings of said test waveform and includes a waveform formatter for forming said test waveform according to said pulses generated by said pulse generation circuit,
wherein the pulse generation circuit includes a pulse formation circuit for generating pulses and a dummy pulse control circuit for controlling generation of a dummy pulse in a no-pulse-generation cycle from the pulse formation circuit by detecting said no-pulse-generation cycle from the test pattern data that has information for determining whether to generate pulses from the pulse formation circuit and includes a logical gate circuit for eliminating said dummy pulses generated by the pulse formation circuit before outputting pulses to said waveform formatter, and
wherein said dummy pulse control circuit generates a mask signal to eliminate said dummy pulse and outputs the mask single to the logical gate circuit.

* * * * *